US011758524B2

(12) United States Patent
Liu et al.

(10) Patent No.: US 11,758,524 B2
(45) Date of Patent: Sep. 12, 2023

(54) SHORT TRANSMISSION TIME INTERVALS FOR SIDELINK FEEDBACK

(71) Applicant: QUALCOMM Incorporated, San Diego, CA (US)

(72) Inventors: Chih-Hao Liu, San Diego, CA (US); Yisheng Xue, San Diego, CA (US); Jing Sun, San Diego, CA (US); Lik Hang Silas Fong, Bridgewater, NJ (US); Xiaoxia Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 17/458,223

(22) Filed: Aug. 26, 2021

(65) Prior Publication Data

US 2023/0067706 A1   Mar. 2, 2023

(51) Int. Cl.
*H04W 4/00* (2018.01)
*H04W 72/0446* (2023.01)
*H04L 5/00* (2006.01)
*H04W 52/02* (2009.01)

(52) U.S. Cl.
CPC ....... *H04W 72/0446* (2013.01); *H04L 5/0053* (2013.01); *H04W 52/0209* (2013.01)

(58) Field of Classification Search
CPC ......... H04W 72/0446; H04W 52/0209; H04W 76/14; H04W 92/18; H04L 5/0053; H04L 5/0049
See application file for complete search history.

(56) References Cited

U.S. PATENT DOCUMENTS

| 11,546,095 | B2* | 1/2023 | Kim | H04W 72/1263 |
| 2020/0146000 | A1* | 5/2020 | Shin | H04W 4/40 |
| 2021/0127377 | A1* | 4/2021 | Lee | H04L 5/0044 |

(Continued)

OTHER PUBLICATIONS

Huawei, et al., "Design and Contents of PSCCH and PSFCH", R1-1906596, 3GPP TSG RAN WG1 Meeting #97, 3rd Generation Partnership Project, Mobile Competence Centre, 650, Route Des Lucioles, F-06921 Sophia-Antipolis Cedex, France, vol. RAN WG1, no. Reno, USA, May 13, 2019-May 17, 2019, May 13, 2019, XP051728047, 12 Pages, sections 2, 3, p. 4, paragraph 3.1, p. 5, paragraph 3.1.1, p. 8, paragraph 3.2, p. 9, paragraph 3.3, figure 4.

(Continued)

*Primary Examiner* — Abdelnabi O Musa
(74) *Attorney, Agent, or Firm* — Holland & Hart LLP

(57) ABSTRACT

Methods, systems, and devices for wireless communications are described. A sidelink message may be scheduled for a UE during a first short transmission time interval (TTI). The first short TTI and a second short TTI for transmitting a sidelink feedback message corresponding to the sidelink message may both be shorter in duration than a another, longer type of TTI. The UE may transmit automatic gain control information in a first symbol period of the second TTI, transmit the sidelink feedback message in a second symbol period of the second TTI (after the first symbol period of the second TTI), and switch from operating in a transmitting mode to operating in a receiving mode during a third symbol period of the second TTI (after the second symbol period of the second TTI).

30 Claims, 12 Drawing Sheets

(56) References Cited

U.S. PATENT DOCUMENTS

| | | | |
|---|---|---|---|
| 2021/0194652 A1* | 6/2021 | Khoryaev | H04L 5/0048 |
| 2021/0219268 A1* | 7/2021 | Li | H04W 72/20 |
| 2022/0053521 A1* | 2/2022 | Yoshioka | H04L 1/1896 |
| 2022/0174655 A1* | 6/2022 | Tsai | H04W 4/40 |
| 2022/0225277 A1* | 7/2022 | Wu | H04L 27/26025 |
| 2022/0225297 A1* | 7/2022 | Wang | H04W 72/23 |
| 2022/0232566 A1* | 7/2022 | Ji | H04L 5/0053 |
| 2022/0303949 A1* | 9/2022 | Hosseini | H04W 24/08 |
| 2022/0317229 A1* | 10/2022 | Baek | G01S 5/009 |
| 2022/0361146 A1* | 11/2022 | Wang | H04W 72/1263 |
| 2022/0393808 A1* | 12/2022 | Yang | H04L 1/1896 |
| 2022/0407647 A1* | 12/2022 | Baek | H04W 72/20 |
| 2022/0417926 A1* | 12/2022 | Balasubramanian | H04W 72/23 |
| 2022/0417946 A1* | 12/2022 | Khoryaev | H04W 92/18 |
| 2023/0084636 A1* | 3/2023 | Hosseini | H04L 5/0051 370/329 |
| 2023/0101632 A1* | 3/2023 | Liu | H04L 1/1896 370/329 |

OTHER PUBLICATIONS

Huawei, et al., "PSFCH Formats for NR V2X", 3GPP TSG RAN WG1 Meeting #96bis, R1-1905899, 3rd Generation Partnership Project, Mobile Competence Centre, 650, Route Des Lucioles, F-06921 Sophia-Antipolis Cedex, France, vol. RAN WG1, No. Xi'an, China, Apr. 8, 2019-Apr. 12, 2019, Apr. 15, 2019, 5 Pages, XP051707942, p. 1, paragraph 1, p. 1, paragraph 2.1, figure 1.
International Search Report and Written Opinion—PCT/US2022/041695—ISA/EPO—dated Dec. 6, 2022.

* cited by examiner

SHORT TRANSMISSION TIME INTERVALS FOR SIDELINK FEEDBACK

FIELD OF TECHNOLOGY

The following relates to wireless communications, including short transmission time intervals for sidelink feedback.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE). Some wireless systems may support sidelink communications, which may be direct communications between two or more UEs.

SUMMARY

The described techniques relate to improved methods, systems, devices, and apparatuses that support short transmission time intervals for sidelink feedback (TTIs). A longer TTI (e.g., slot) may be divided into multiple short TTIs (e.g., mini-slots). Some or all short TTIs within longer TTI may be configured to carry sidelink feedback, and such short TTIs may be time-division or frequency-division multiplexed with other short TTIs (e.g., short TTIs carrying sidelink data or control information). In some cases, a UE may transmit automatic gain control information in a first (e.g., initial) symbol period of a short TTI, transmit a sidelink feedback message in a second (e.g., middle) symbol period of the short TTI that occurs after the first symbol period of the short TTI, and observe a switching gap in a third (e.g., last) symbol period of the short TTI that occurs chronologically after the second symbol period. By using short TTIs for sidelink feedback, latency associated with sidelink feedback messages may be reduced, and hence overall latency and reliability for sidelink communications may be improved, among other possible benefits.

A method for wireless communication at a user equipment (UE) is described. The method may include identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval, transmitting automatic gain control information in a first symbol period of the second transmission time interval, transmitting the sidelink feedback message in a second symbol period of the second transmission time interval that occurs chronologically after the first symbol period of the second transmission time interval, and switching from operating the UE in a transmitting mode to operating the UE in a receiving mode during a third symbol period of the second transmission time interval that occurs chronologically after the second symbol period of the second transmission time interval.

An apparatus for wireless communication at a UE is described. The apparatus may include a processor, memory coupled with the processor, and instructions stored in the memory. The instructions may be executable by the processor to cause the apparatus to identify, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval, transmit automatic gain control information in a first symbol period of the second transmission time interval, transmit the sidelink feedback message in a second symbol period of the second transmission time interval that occurs chronologically after the first symbol period of the second transmission time interval, and switch from operating the UE in a transmitting mode to operating the UE in a receiving mode during a third symbol period of the second transmission time interval that occurs chronologically after the second symbol period of the second transmission time interval.

Another apparatus for wireless communication at a UE is described. The apparatus may include means for identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval, means for transmitting automatic gain control information in a first symbol period of the second transmission time interval, means for transmitting the sidelink feedback message in a second symbol period of the second transmission time interval that occurs chronologically after the first symbol period of the second transmission time interval, and means for switching from operating the UE in a transmitting mode to operating the UE in a receiving mode during a third symbol period of the second transmission time interval that occurs chronologically after the second symbol period of the second transmission time interval.

A non-transitory computer-readable medium storing code for wireless communication at a UE is described. The code may include instructions executable by a processor to identify, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval, transmit automatic gain control information in a first symbol period of the second transmission time interval, transmit the sidelink feedback message in a second symbol period of the second transmission time interval that occurs chronologically after the first symbol period of the second transmission time interval, and switch from operating the UE in a transmitting mode to operating the UE in a receiving mode during a third symbol period of the second transmission time interval that occurs chronologically after the second symbol period of the second transmission time interval.

Some examples of the method, apparatuses, and non-transitory computer-readable medium described herein may further include operations, features, means, or instructions for receiving configuration signaling that indicates, for a set of multiple consecutive transmission time intervals that includes the second transmission time interval, that a first subchannel may be allocated to sidelink feedback messages and a second subchannel different than the first subchannel may be allocated to sidelink data or control information.

Some examples of the method, apparatuses, and non-transitory computer-readable medium described herein may further include operations, features, means, or instructions for receiving a bitmap that indicates a set of physical resource blocks for carrying sidelink feedback messages within a sidelink bandwidth part, where the sidelink feedback message may be transmitted via one or more physical resource blocks of the set of physical resource blocks.

In some examples of the method, apparatuses, and non-transitory computer-readable medium described herein, the third transmission time interval includes a set of multiple transmission time intervals, the second transmission time interval and a fourth transmission time interval included in the set of multiple transmission time intervals and the sidelink feedback message may be transmitted within a subchannel that may be allocated for sidelink data or control information during the fourth transmission time interval.

Some examples of the method, apparatuses, and non-transitory computer-readable medium described herein may further include operations, features, means, or instructions for receiving an indication of a periodicity for a resource pool that includes the set of multiple transmission time intervals, where a subset of one or more transmission time intervals may be allocated for sidelink feedback messages within the set of multiple transmission time intervals based on the periodicity.

Some examples of the method, apparatuses, and non-transitory computer-readable medium described herein may further include operations, features, means, or instructions for receiving a bitmap that indicates a set of physical resource blocks for carrying the sidelink feedback message within the second symbol period, where the sidelink feedback message may be transmitted via one or more physical resource blocks of the set of physical resource blocks.

Some examples of the method, apparatuses, and non-transitory computer-readable medium described herein may further include operations, features, means, or instructions for receiving a subset of sidelink feedback resource indices of a set of multiple sidelink feedback resource indices, where the set of multiple sidelink feedback resource indices may be mapped to a set of multiple cyclic shift pairs and a set of multiple physical resource blocks, and where the sidelink feedback message may be transmitted via one or more physical resource blocks and using a cyclic shift pair corresponding to one of the subset of sidelink feedback resource indices.

Some examples of the method, apparatuses, and non-transitory computer-readable medium described herein may further include operations, features, means, or instructions for receiving a feedback delay value that indicates a location of the second transmission time interval within the third transmission time interval.

Some examples of the method, apparatuses, and non-transitory computer-readable medium described herein may further include operations, features, means, or instructions for transmitting a power reservation signal in an initial symbol of the third transmission time interval based on the first transmission time interval in which the sidelink message may be scheduled being before the third transmission time interval that includes the second transmission time interval.

In some examples of the method, apparatuses, and non-transitory computer-readable medium described herein, the power reservation signal may be based on a reference signal.

In some examples of the method, apparatuses, and non-transitory computer-readable medium described herein, the reference signal includes a comb-based reference signal, and a comb value for the reference signal may be based on a location of the second transmission time interval within the third transmission time interval.

In some examples of the method, apparatuses, and non-transitory computer-readable medium described herein, the power reservation signal may be transmitted within a same resource block location in a frequency domain as the sidelink feedback message.

In some examples of the method, apparatuses, and non-transitory computer-readable medium described herein, a sidelink feedback resource partition includes a set of physical resource blocks, and a quantity of physical resource blocks within the set of physical resource blocks may be based on a second quantity of physical resource blocks allocated for sidelink feedback messages within the second transmission time interval, a quantity of transmission time intervals allocated to sidelink messages and corresponding to the second transmission time interval, a quantity of subchannels included in the sidelink feedback resource partition, or any combination thereof.

Some examples of the method, apparatuses, and non-transitory computer-readable medium described herein may further include operations, features, means, or instructions for selecting a physical resource block of the set of physical resource blocks for transmitting the sidelink feedback message based on a time-first-then-frequency mapping between resources allocated to the sidelink messages and the set of physical resource blocks.

In some examples of the method, apparatuses, and non-transitory computer-readable medium described herein, when a format of the sidelink feedback message may be based on a physical uplink control channel format 0 waveform, a quantity of sidelink feedback resources within the sidelink feedback resource partition may be based on the quantity of physical resource blocks and a quantity of cyclic shift pairs per physical resource block of the set of physical resource blocks.

In some examples of the method, apparatuses, and non-transitory computer-readable medium described herein, when a format of the sidelink feedback message may be based on a physical uplink control channel format 1 waveform, a quantity of sidelink feedback resources within the sidelink feedback resource partition may be based on the quantity of physical resource blocks, an orthogonal code spreading factor, and a quantity of cyclic shift pairs per physical resource block of the set of physical resource blocks.

Some examples of the method, apparatuses, and non-transitory computer-readable medium described herein may further include operations, features, means, or instructions for selecting a sidelink feedback resource within the sidelink feedback resource partition based on a first value modulo a second value, where the first value may be based on a sum of a layer 1 source identifier and a group member identifier associated with the sidelink message, where the second value may be based on a product of the quantity of physical resource blocks and a quantity of cyclic shift pairs per physical resource block of the set of physical resource blocks, and where the sidelink feedback message may be transmitted via the selected sidelink feedback resource.

In some examples of the method, apparatuses, and non-transitory computer-readable medium described herein, the sidelink feedback message may be transmitted based on a physical control channel format 0 based on the second symbol period including three or fewer symbols.

In some examples of the method, apparatuses, and non-transitory computer-readable medium described herein, the sidelink feedback message may be transmitted based on a physical control channel format 1 based on the second symbol period including at least four symbols.

In some examples of the method, apparatuses, and non-transitory computer-readable medium described herein, transmitting the sidelink feedback message in the second symbol period may include operations, features, means, or instructions for transmitting a waveform in an initial symbol of the second symbol period and transmitting a respective repetition of the waveform in each additional symbol of the second symbol period.

Some examples of the method, apparatuses, and non-transitory computer-readable medium described herein may further include operations, features, means, or instructions for selecting the second transmission time interval to transmit the sidelink feedback message based on a feedback timing configuration and a timing of the second transmission time interval relative to the first transmission time interval.

In some examples of the method, apparatuses, and non-transitory computer-readable medium described herein, the feedback timing configuration may be based on a fixed feedback timeline, a feedback delay value indicated in sidelink control information received by the UE, or both.

In some examples of the method, apparatuses, and non-transitory computer-readable medium described herein, the first symbol period includes an initial symbol of the second transmission time interval, the third symbol period includes a final symbol of the second transmission time interval, and the second symbol period includes one or more symbols, the one or more symbols including each symbol of the second transmission time interval between the initial symbol and the final symbol.

DETAILED DESCRIPTION

Figure 1:
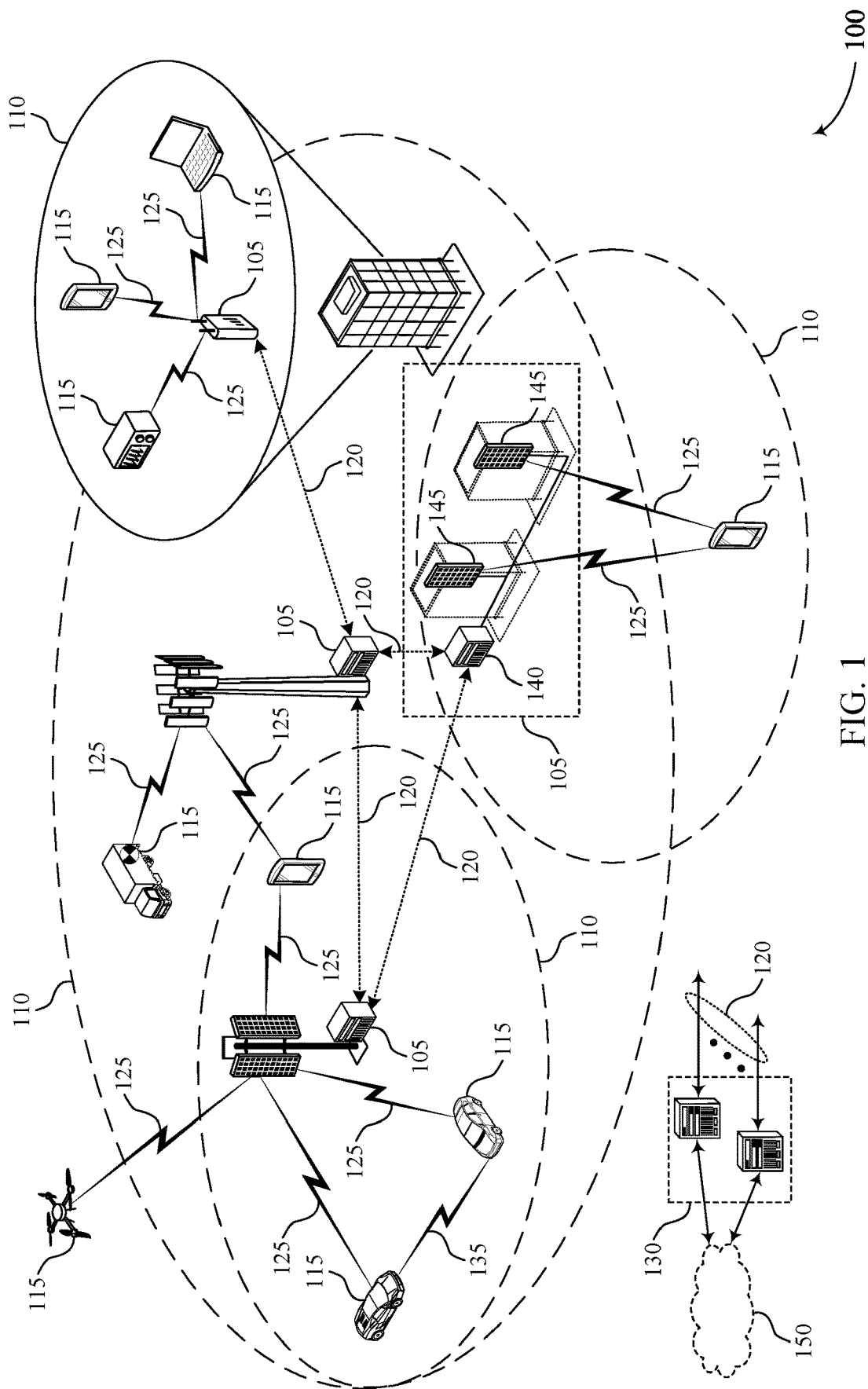
FIG. 1 illustrates an example of a wireless communications system that supports short transmission time intervals for sidelink feedback in accordance with aspects of the present disclosure.

Sidelink communications in some wireless communication systems may have relatively high latency, resulting in communication delays or other drawbacks. The relatively high latency may relate at least in part to sidelink feedback messages, such as acknowledgement/negative-acknowledgement feedback (ACK/NACK feedback) being allocated to the end of slots in a slot-based configuration (e.g., to the last symbol of a 14-symbol slot).

As described herein, however, sidelink feedback messages may be transmitted using short TTIs (e.g., mini-slots) rather than full TTIs (e.g., slots), which may reduce the latency of sidelink feedback, and hence, provide for improved latency and reliability of sidelink communications overall, among other possible benefits. For example, a sidelink UE may receive control signaling from a base station or from another sidelink UE that indicates to the sidelink UE to implement scheduling based on short TTIs, such as mini-slots. Multiple mini-slots may occur within one full slot (e.g., multiple short TTIs within one full TTI). In some cases, a full slot (e.g., full TTI) may include 14 symbols (e.g., 14-symbol slot), while a mini-slot (e.g., short TTI) may include fewer symbols (e.g., a subset of the 14 symbols).

Some or all short TTIs (e.g., mini-slots) within a full TTI (e.g., slot) may be configured to carry sidelink feedback. Further, a short TTI for sidelink feedback may be time-division multiplexed or frequency-division multiplexed with one or more other short TTIs (e.g., multiplexed with short TTIs carrying sidelink data or control information). In some cases, within a short TTI configured to carry sidelink feedback, a first symbol period may include automatic gain control (AGC) information, a subsequent second symbol period may include sidelink feedback information, and a subsequent third symbol may include a switching gap to provide a time during which a UE may switch operating modes (e.g., from a transmitting mode to a receiving mode or vice versa).

Based on the use of short TTIs for sidelink feedback as described herein, a sidelink UE may transmit sidelink feedback earlier than such feedback would otherwise occur (e.g., before an end symbol of a slot that would otherwise include the mini-slot). Thus, techniques as described herein may reduce the latency of feedback (e.g., ACK/NACK feedback) associated with sidelink communications, which may in turn reduce the latency or otherwise improve the performance of sidelink communications overall. For example, additionally or alternatively, use short TTIs for sidelink feedback as described herein may help avoid at least some failed transmissions ad associated retransmissions, may increase throughput for sidelink communications, may increasing the reliability of sidelink communications, or any combination thereof, among other possible benefits.

Aspects of the disclosure are initially described in the context of wireless communications systems. Aspects of the disclosure are further illustrated by and described with reference to environments of slot and mini-slot configurations that relate to sidelink feedback channel for transmission time intervals. Aspects of the disclosure are further illustrated by and described with reference to apparatus diagrams, system diagrams, and flowcharts that relate to sidelink feedback channel for transmission time intervals. Though certain aspects of the disclosure may be described with reference to slots and mini-slots, the teachings herein may be applied to other types of full TTIs (e.g., long TTIs) and short TTIs as well.

FIG. 1 illustrates an example of a wireless communications system 100 that supports short transmission time intervals for sidelink feedback in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$)

and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

In some examples, a UE 115 may identify a short TTI (e.g., mini-slot) for transmitting a sidelink feedback message (e.g., via PSFCH). In some cases, the short TTI may be associated with a sidelink message (e.g., via PSSCH) scheduled for a previous short TTI (e.g., (e.g., that was received or scheduled to be received during a previous mini-slot during the same slot or a previous slot). The short TTI for transmitting the sidelink feedback message and the previous short TTI may be shorter than a full TTI (e.g., shorter than a slot). In some cases, within the short TTI for transmitting a sidelink feedback message, the UE 115 may transmit automatic gain control information in a first (e.g., initial)

symbol period, and the UE 115 may transmit the sidelink feedback message in a second (e.g., middle) symbol period that occurs after the first symbol period. And in some cases, a third (e.g., last) symbol period of the short TTI for transmitting the sidelink feedback message may include a switching gap, where the third symbol period occurs after the second symbol period. The UE 115 may switch an operating mode (e.g., switch from a transmitting mode to a receiving mode, or from a receiving mode to a transmitting mode) during the third symbol period. The short TTI for transmitting the sidelink feedback message may be time-division or frequency-division multiplexed with one or more other short TTIs (e.g., one or more other short TTIs carrying sidelink data or control information).

Figure 2:
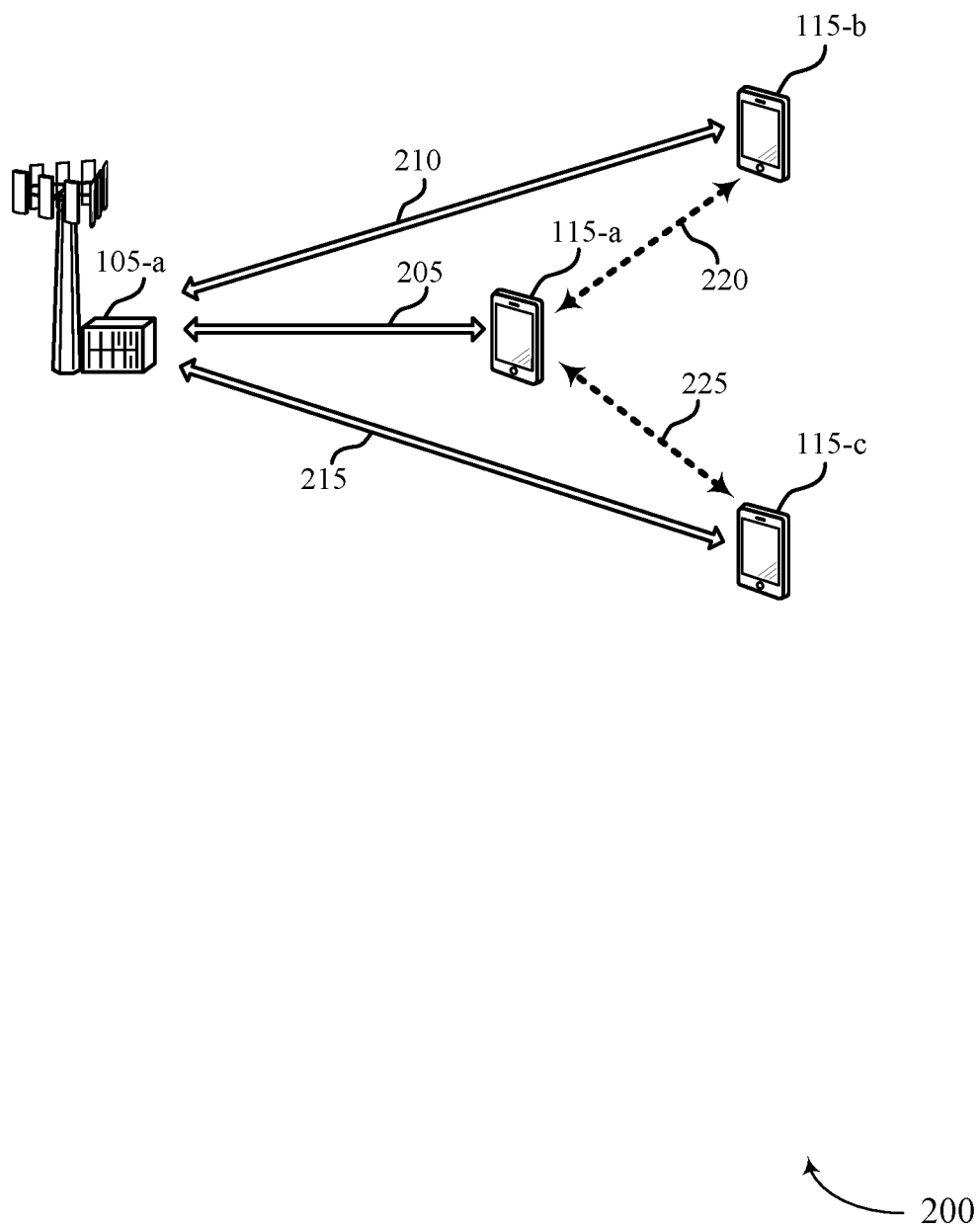
FIG. 2 illustrates an example of an environment that supports short transmission time intervals for sidelink feedback in accordance with aspects of the present disclosure.

FIG. 2 illustrates an example of an environment 200 that supports short transmission time intervals for sidelink feedback in accordance with aspects of the present disclosure.

As illustrated, environment 200 may include UE 115-*a*, UE 115-*b*, UE 115-*c*, and base station 105-*a*, any of which may be an example of a UE 115 or a base station 105, respectively, as described herein with reference to FIG. 1. Wireless communications system 200 may also include a direct link 205 between base station 105-*a* and UE 115-*a*, a direct link 210 between base station 105-*a* and UE 115-*b*, and a direct link 215 between base station 105-*a* and UE 115-*c*. Wireless communications system 200 may also include a sidelink 220 between UE 115-*a* and UE 115-*b* and a sidelink 225 between UE 115-*a* and UE 115-*c*. In some examples, direct link 205, direct link 210, and direct link 215 may each include a downlink and an uplink. In some examples, base station 105-*a* may use the downlink of direct link 205 to convey control and/or data information to UE 115-*a*. And UE 115-*a* may use the uplink of direct link 205 to convey control and/or data information to base station 105-*a*. In some cases, the downlink of direct link 205 may use different time and/or frequency resources than the uplink of direct link 205. In some cases, UE 115-*a* may use sidelink 220 to convey control and/or data information (e.g., a sidelink message) to UE 115-*b*, while UE 115-*b* may use sidelink 220 to convey control and/or data information to UE 115-*a*. In some cases, UE 115-*a* may use sidelink 225 to convey control and/or data information to UE 115-*c*, while UE 115-*c* may use sidelink 225 to convey control and/or data information to UE 115-*a*. In some cases, UE 115-*a* may use sidelink 220 to convey sidelink feedback information (e.g., ACK/NACK) to UE 115-*b*, while UE 115-*b* may use sidelink 220 to convey sidelink feedback information to UE 115-*a*. In some cases, UE 115-*a* may use sidelink 225 to convey sidelink feedback information to UE 115-*c*, while UE 115-*c* may use sidelink 225 to convey sidelink feedback information to UE 115-*a*.

In some examples, a UE 115-*a* (e.g., UE 115-*a*, UE 115-*a*-*b*, UE 115-*a*-*c*) may receive a sidelink message (e.g., via PSSCH) scheduled at a first mini-slot of a first slot. In some cases, the first slot may include one or more mini-slots including the first mini-slot. In some cases, UE 115-*a* may identify a second mini-slot, of a second slot subsequent to the first slot, for transmitting a sidelink feedback message (e.g., via PSFCH) that is associated with the received sidelink message. In some cases, the second slot includes one or more mini-slots, including the second mini-slot. In some cases, the first mini-slot is shorter in time than the first slot, and the second mini-slot is shorter in time than the second slot.

In some examples, UE 115-*a* may transmit automatic gain control information in a first symbol period (e.g., initial symbol period) of the second mini-slot. In some cases, UE 115-*a* may transmit the automatic gain control information to enable automatic gain control at legacy UEs or non-legacy UEs. In some cases, the first symbol period occurs chronologically first among the symbol periods of the second mini-slot. In some cases, UE 115-*a* may transmit the sidelink feedback message in a second symbol period (e.g., middle symbol period) of the second mini-slot. In some cases, the second symbol period occurs chronologically after the first symbol period of the second mini-slot. In some cases, UE 115-*a* may observe a switching gap in a third symbol period (e.g., last symbol period) of the second mini-slot that occurs chronologically after the second symbol period of the second mini-slot. In some cases, the first symbol period includes one symbol, the second symbol period includes one or more symbols, and the third symbol period includes one symbol. In some cases, the one or more symbols of the second symbol period may include each symbol of the second mini-slot between the first symbol period and the third symbol period.

In some examples, the second symbol period may include multiple symbols (e.g., two or more symbols of a 14-symbol slot). In some cases, UE 115-*a* may transmit a waveform in an initial symbol of the second symbol period. In some cases, UE 115-*a* may transmit a respective repetition of the waveform in each additional symbol of the second symbol period.

In some examples, UE 115-*a* may select the second mini-slot to transmit the sidelink feedback message based on a feedback timing configuration and a timing of the second mini-slot relative to the first mini-slot that includes the corresponding sidelink message. In some cases, the feedback timing configuration may be based on a fixed feedback timeline or based on a feedback delay value (e.g., K1) indicated in sidelink control information received by UE 115-*a*, or based on both.

In some examples, UE 115-*a* may transmit the sidelink feedback message based on a PUCCH format 0 waveform when the middle symbol period includes 3 or fewer symbols (i.e., the mini-slot includes 5 or fewer symbols). In some cases, UE 115-*a* may transmit the sidelink feedback message based on a PUCCH format 1 waveform when the middle symbol period includes 4 or more symbols (i.e., the mini-slot includes more than 5 symbols). Within a mini-slot, UE 115-*a* may repeat the transmission in a first sidelink feedback symbol in one or more subsequent sidelink feedback symbols (e.g., when the middle symbol period includes 3 or fewer symbols). For a four-symbol sidelink feedback mini-slot, UE 115-*a* may repeat the first symbol of the sidelink feedback mini-slot in the second symbol of the sidelink feedback mini-slot, similar to PUCCH format 0 except without frequency mirror hopping (e.g., frequency hopping across a slot boundary or mini-slot boundary within a subframe).

In some examples, UE 115-*a* may receive configuration signaling from base station 105-*a* (e.g., via direct link 205) or from another UE 115 via sidelink communications (e.g., from UE 115-*b* via sidelink 220, from UE 115-*c* via sidelink 225). In some cases, the configuration signaling may indicate that, within a set of consecutive mini-slots of a given slot, one or more subchannels are allocated for transmitting sidelink feedback information apart from allocations for sidelink data or sidelink control information.

In some examples, UE 115-*a* may receive a bitmap (e.g., rbSetPSFCH bitmap) from base station 105-*a* or from another UE 115 via sidelink communications. In some cases, the bitmap may indicate a set of physical resource blocks for carrying the sidelink feedback information in a sidelink bandwidth part. In some cases, multiple mini-slots may occur within a given slot. In some cases, a mini-slot that includes sidelink feedback may be in the same subchannel as a mini-slot that includes sidelink data or sidelink control information.

In some examples, UE 115-*a* may receive an indication of a periodicity from base station 105-*a* or from another UE 115. In some cases, the periodicity may specify which mini-slots of a given slot are for sidelink feedback. In some cases, UE 115-*a* may receive a bitmap (rbSetPSFCH bitmap) that indicates a set of physical resource blocks for carrying the sidelink feedback information within the middle symbol period.

In some examples, UE 115-*a* may receive from base station 105-*a* or from another UE 115 via sidelink communications a subset of a set of indices for sidelink feedback resources, where the indices are mapped to cyclic shift pairs and physical resource blocks. In some cases, UE 115-*a* may receive a feedback delay value (e.g., K1) that indicates or enables UE 115-*a* to determine a location of the PSFCH mini-slot within the slot.

In some examples, UE 115-*a* may receive a sidelink message in a first slot (e.g., in a first short physical shared channel (sPSSCH) mini-slot). In some cases, UE 115-*a* may transmit a power reservation signal in a first symbol (e.g., in symbol 0, in at least a portion of symbol 0) of a second slot subsequent to the first slot. In some cases, UE 115-*a* may transmit the power reservation signal in the first symbol (e.g., first symbol of a mini-slot) based on the corresponding sidelink message being in the first slot. In some cases, the power reservation signal may be based on a reference signal. In some cases, this reference signal may be a comb-based reference signal. In some cases, a comb value for the reference signal may be based on a location of the sidelink feedback mini-slot within the slot (e.g., based on an index of the sidelink feedback mini-slot). In some cases, UE 115-*a* may transmit the power reservation signal within a same resource block location in a frequency domain as the sidelink feedback message.

Aspects of the subject matter described herein may be implemented to realize one or more advantages. The described techniques may support improvements in system efficiency such that a device may decrease latency associated with sidelink feedback channel (e.g., ACK/NACK feedback). Additionally, described techniques may result in avoiding multiple retransmissions and failed transmissions, decreasing system latency, increasing throughput, increasing the reliability of sidelink feedback, and improving user experience.

Figure 3:
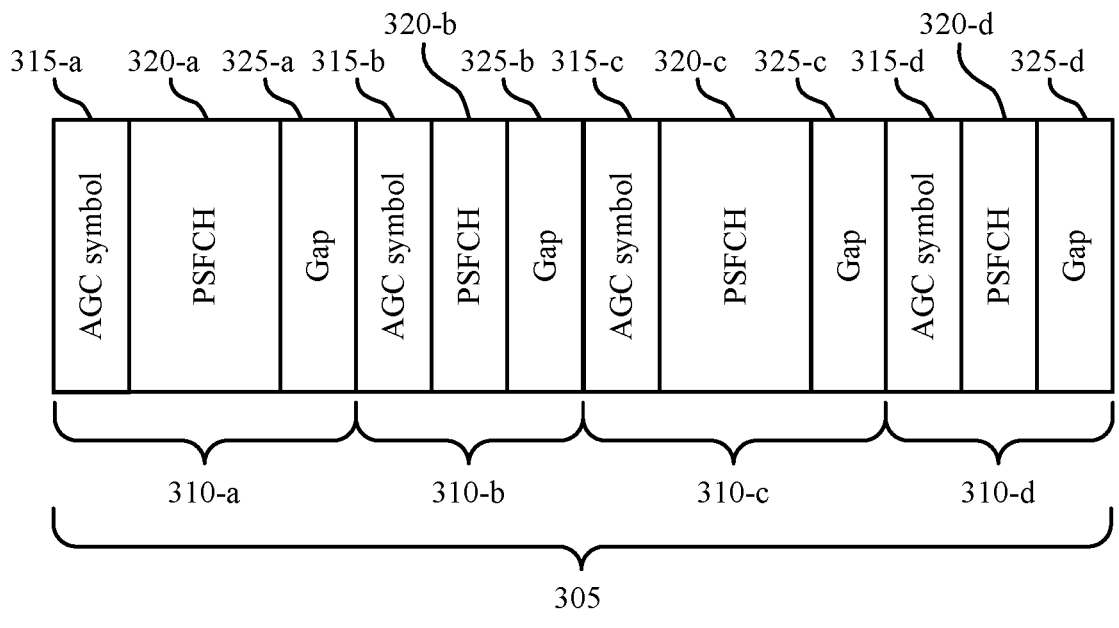
FIG. 3 illustrates an example of an environment that supports short transmission time intervals for sidelink feedback in accordance with aspects of the present disclosure.

FIG. 3 illustrates an example of an environment 300 that supports short transmission time intervals for sidelink feedback in accordance with aspects of the present disclosure.

In the illustrated example, environment 300 may include slot 305. As shown, slot 305 may include mini-slots 310 (e.g., 310-*a*, 310-*b*, 310-*c*, 310-*d*). As shown, each mini-slot 310 may include a first symbol period 315 (e.g., 315-*a*, 315-*b*, 315-*c*, 315-*d*), a second symbol period 320 (e.g., 320-*a*, 320-*b*, 320-*c*, 320-*d*), and a third symbol period 325 (e.g., 325-*a*, 325-*b*, 325-*c*, 325-*d*). As shown, each second symbol period 320 of slot 305 may include one or more symbols, which may be immediately subsequent to each first symbol period 315 of slot 305 and immediately prior to each third symbol period 325 of slot 305.

In the illustrated example, the first symbol period 315 of each mini-slot 310 may include a single symbol that occurs chronologically first among the symbol periods of each mini-slot 310 and that is configured to transmit automatic gain control (AGC) information. As shown, the $0^{th}$ symbol (e.g., chronologically first symbol, the initial first symbol period 315) of slot 305 may include AGC information. In some cases, the AGC information of a first symbol period 315 may be or may be based on a duplicate of a PSFCH symbol of a second symbol period 320. In some cases, the AGC information of a first symbol period 315 may be or may be based on a reference signal. In some cases, first symbol period 315-*a* of mini-slot 310-*a* may carry AGC power reservation signals of a subsequent mini-slot (e.g., 310-*b*, 310-*c*, 310-*d*).

In the illustrated example, the second symbol period 320 of each mini-slot 310 occurs chronologically after the first symbol period of each mini-slot 310 and may be configured to transmit a sidelink feedback message (e.g., via physical sidelink feedback channel (PSFCH)). As shown, the third symbol period 325 of each mini-slot 310 occurs chronologically after the second symbol period of each mini-slot 310 and may include a switching gap to enable a UE to switch between a transmitting mode and a receiving mode.

In some examples, the sidelink data receiving UE may transmit a reservation signal at the first symbol of a mini-slot when the sidelink data receiving UE determines it will transmit mini-slot PSFCH in the slot. In some cases, a PSFCH waveform may be included in each mini-slot 310. In some cases, the PSFCH waveform may be time domain multiplexed with a corresponding sPSSCH mini-slot (e.g., data mini-slot). In some cases, the PSFCH waveform may be frequency domain multiplexed with a corresponding sPSSCH mini-slot. In some cases, mini-slots 310 may occupy one or more pre-configured subchannels or physical resource blocks. In some cases, a sidelink data receiving UE may adapt a PSFCH format based on a mini-slot duration in which sidelink feedback (e.g., ACK/NACK) is to be sent by the sidelink data receiving UE to the sidelink data transmitting UE.

In some cases, a location of a mini-slot within a slot may correspond to a mini-slot index (e.g., first mini-slot of a slot maps to a first mini-slot index, second mini-slot of the slot maps to a second mini-slot index, etc.). For example, each mini-slot included in the time period of a slot may have a unique mini-slot index (e.g., mini-slot 0, mini-slot 1, and so on within a first slot), within the index values starting over at the beginning of a next slot (e.g., mini-slot 0, mini-slot 1, and so on within a second slot after the first slot).

In some cases, a PSFCH resource for sPSSCH sidelink feedback may be based on a mini-slot index and one or more subchannels of the associated sPSSCH, where each PSFCH resource is located within a mini-slot index in the time domain and at least one subchannel in the frequency domain. In some cases, a location of a sidelink feedback resource may be based on a mini-slot index and a corresponding subchannel, where each PSFCH resource is located within a mini-slot index in the time domain and one subchannel in the frequency domain. In some cases, a PSFCH resource for sPSSCH sidelink feedback may be based on an explicit resource index and a feedback delay value (e.g., K1) indicated in sidelink control information received by the sidelink data receiving UE, where the explicit resource index corresponds to the PSFCH resource and the PSFCH resource is in a mini-slot located in relation to a location of the sidelink control information in the time domain and the feedback delay value from the location of the sidelink control information.

In the illustrated example, a given mini-slot 310 may include X=3 or more symbols depending on a mini-slot configuration (e.g., received from a base station or a sidelink UE). Besides the AGC symbol of the first symbol period 315 and gap symbol of the third symbol period 325, there may be X−2 sidelink feedback symbols (e.g., PSFCH symbols) in a given mini-slot 310.

In some examples, a mini-slot configuration may include a PSFCH waveform based on a PUCCH format 0 that supports 1 or 2 sidelink feedback symbols. When a PSFCH waveform based on PUCCH format 0 (e.g., without frequency mirror hopping) is used, a given mini-slot 310 may include 3 symbols (e.g., 1 AGC symbol, 1 PSFCH symbol, and 1 gap symbol) or 4 symbols (e.g., 1 AGC symbol, 2 PSFCH symbols, and 1 gap symbol). With 4 symbols in a given mini-slot 310 with a PSFCH waveform based on PUCCH format 0, a UE may repeat the first PSFCH symbol in the second PSFCH symbol (one of the two PSFCH symbols is a duplicate of the other).

In some examples, a given mini-slot 310 may include 5 symbols (e.g., 1 AGC symbol, 3 PSFCH symbols, and 1 gap symbol). With 5 symbols in a given mini-slot 310, a UE may repeat a first PSFCH symbol (e.g., format 0 symbol) in the second PSFCH symbol and in the third PSFCH symbol (two of the three PSFCH symbols are duplicates of the other).

In some examples, a mini-slot configuration may include a PSFCH waveform based on a PUCCH format 1 that supports a mini-slot with 4 to 14 symbols (e.g., 2 to 12 sidelink feedback symbols, plus AGC symbol and gap symbol). In some cases, a UE may apply a time-domain orthogonal cover code to one or more symbols of a given mini-slot 310 with a PSFCH waveform based on the PUCCH format 1. Along with cyclic shift, a mini-slot 310 with a with a PSFCH waveform based on PUCCH format 1 may provide more UE multiplexing capacity than a PUCCH format 0 mini-slot.

In some examples, a given mini-slot 310 with a with a PSFCH waveform based on PUCCH format 1 may include 6 symbols (e.g., 1 AGC symbol, 4 PSFCH symbols, and 1 gap symbol). With 6 symbols in a given mini-slot 310, a UE may fill the four PSFCH symbols based on a PUCCH format 1 waveform, where two of the four PSFCH symbols each include a reference signal (e.g., demodulation reference signals) and the other two of the four PSFCH symbols each include an ACK/NACK modulated sequence. In some cases, the UE may apply a length-2 orthogonal cover code on the two ACK/NACK carrying symbols. In some cases, some mini-slot configurations may be based on other PUCCH formats (e.g., PUCCH format 3, PUCCH format 4) to increase the number of available ACK/NACK bits.

In the illustrated example, different mini-slots 310 in the same slot 305 may have different durations. For example, as shown, first symbol periods 315 and third symbol periods 325 may each include one symbol, while second symbol periods 320-a and 320-c may each include two symbols, and second symbol periods 320-b and 320-d may each include one symbol. Accordingly, mini-slots 310-a and 310-a may each include four total symbols, while mini-slots 310-b and 310-d may each include three total symbols.

In some examples, a PSFCH waveform may be extended to an entire given mini-slot 310 in order to maintain constant power for an associated mini-slot UE receiver (e.g., sidelink data receiving UE). In some cases, a sidelink data receiving UE may adjust the PSFCH duration (e.g., 1 PSFCH symbol, 2 PSFCH symbols, etc.) or format (e.g., PUCCH format 0, PUCCH format 1) based on a duration of a mini-slot where sidelink feedback is scheduled to be transmitted (e.g., based on sidelink control information).

In some examples, a sidelink data receiving UE may select a mini-slot in which to transmit sidelink feedback based on a sidelink ACK/NACK timeline. In some cases, the sidelink ACK/NACK timeline may be indicated in sidelink control information. In some cases, the sidelink ACK/NACK timeline may be based on a fixed feedback timeline or a feedback delay value (e.g., K1) received by the UE, or based on both.

In some examples, a UE receiving sidelink data may transmit sidelink feedback in different mini-slots 310 for different PSSCH/sPSSCH, where the different mini-slot may have different durations (e.g., 3 symbols, 4 symbols, etc.). In some cases, a mini-slot duration may dynamically depend on which mini-slot 310 of slot 305 is scheduled to carry the sidelink feedback. In some cases, the sidelink data receiving UE may adjust the PFSCH duration or PFSCH format, or both, based on the dynamically-dependent mini-slot duration.

Figure 4:
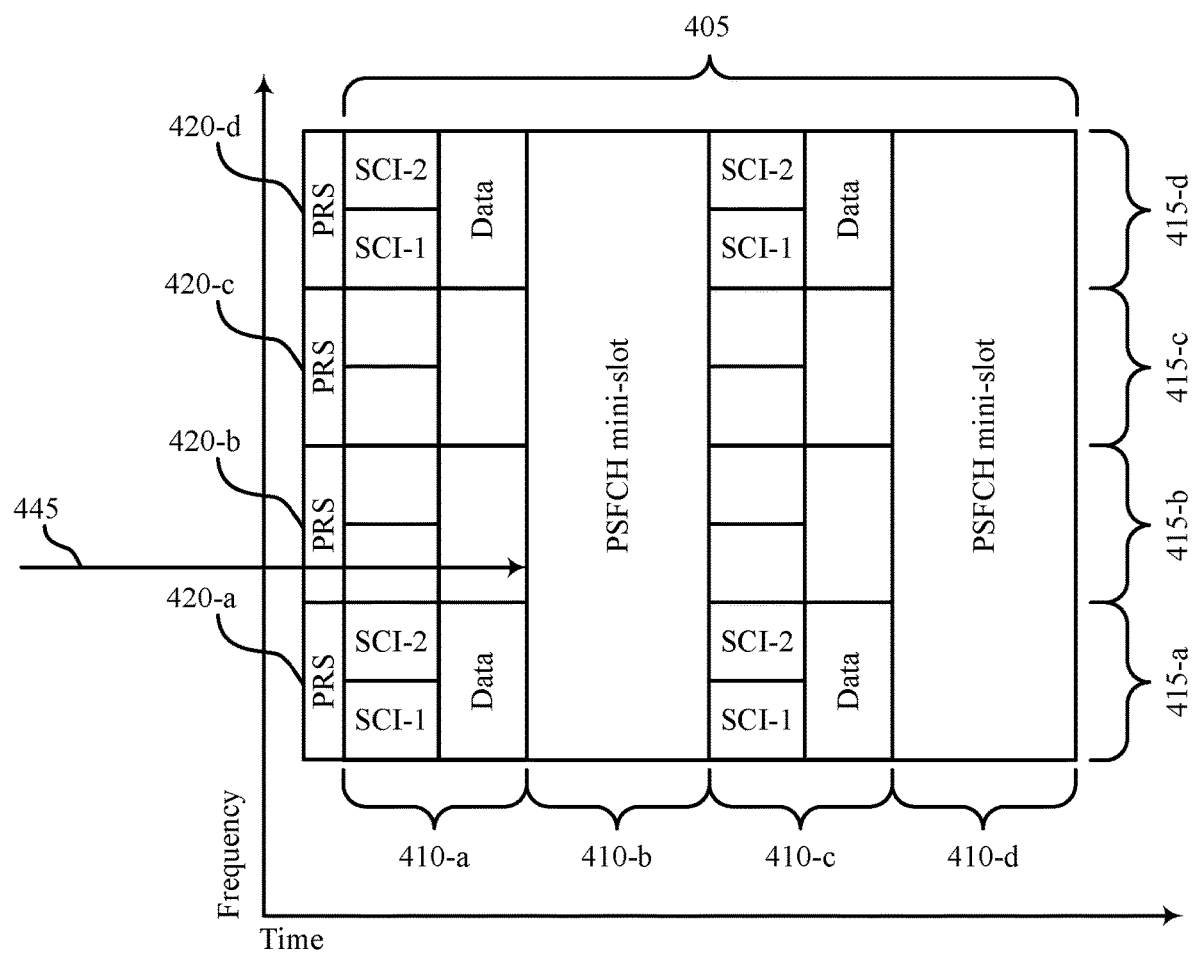
FIG. 4 illustrates an example of an environment that supports short transmission time intervals for sidelink feedback in accordance with aspects of the present disclosure.
Figure 4:
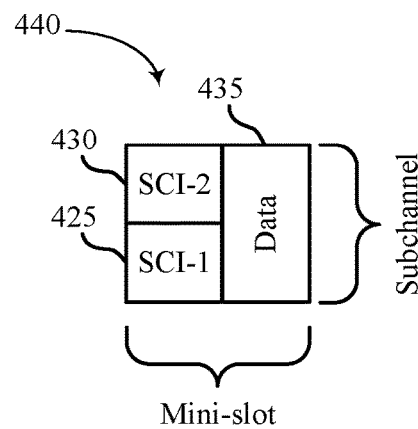

FIG. 4 illustrates an example of an environment 400 that supports short transmission time intervals for sidelink feedback in accordance with aspects of the present disclosure.

In the illustrated example, environment 400 may include slot 405. As shown, slot 405 may include mini-slots 410 (e.g., 410-a, 410-b, 410-c, 410-d). As shown, mini-slot 410-a and mini-slot 410-c (e.g., data mini-slots) may each include one or more control data blocks 440. As shown, each control data block 440 may include first sidelink control information 425, second sidelink control information 430, and sidelink data 435. As shown, mini-slot 410-b and mini-slot 410-d may each include a sidelink feedback mini-slot (e.g., PSFCH mini-slot). In some cases, slot 405 may be preceded (e.g., immediately preceded) by power reservation signals 420 (e.g., 420-a, 420-b, 420-c, 420-d). Thus, environment 400 may be an example in which mini-slots 410 that include PSFCH signaling are time-division multiplexed with mini-slots 410 that include SCI signaling, data signaling, or both.

In the illustrated example, a location of mini-slot 410-b or mini-slot 410-d in slot 405 may be based on a feedback delay 445 that is based on a feedback timing configuration. In some cases, the feedback timing configuration may be based on a fixed feedback timeline or based on a feedback delay value (e.g., K1) indicated in sidelink control information (e.g., of a control data block 440 of a slot prior to slot 405) that is received by the UE, or based on both. In some cases, the feedback delay 445 may be based on a mini-slot index indicating a location of mini-slot 410-b or mini-slot 410-d in slot 405. In some cases, a resource of mini-slot 410-b or mini-slot 410-d may be based on the mini-slot index and one or more subchannels 415. In some cases, a resource of mini-slot 410-b or mini-slot 410-d may be based on a feedback delay value (e.g., K1) and a PSFCH resource index.

In some examples, a resource of mini-slot 410-b or mini-slot 410-d may be based on a mini-slot resource pool. In the mini-slot resource pool, a device (e.g., sidelink UE, base station) may specify which mini-slots 410 of slot 405 carries PSFCH sidelink feedback (e.g., first mini-slot 410 of slot 405 carries PSFCH sidelink feedback, second mini-slot 410 of slot 405 carries PSFCH sidelink feedback). In the illustrated example, the second mini-slot of slot 405 (mini-slot 410-b) and the fourth mini-slot of slot 405 (mini-slot 410-d) are specified to carry PSFCH sidelink feedback.

Additionally, or alternatively, the device may specify the periodicity of a PSFCH mini-slot in terms of mini-slots 410 of slot 405. In some cases, the specified periodicity may indicate how many other mini-slots occur between a PSFCH mini-slot (e.g., every other mini-slot 410 of slot 405 is a PSFCH mini-slot, every third mini-slot 410 of slot 405 is a PSFCH mini-slot, etc.). In the illustrated example, slot 405 is configured with periodicity of two PSFCH mini-slots (e.g., every other mini-slot on the even indexed mini-slots).

In some examples, sidelink control information may schedule resources of a resource pool (e.g., sidelink feedback resource pool) for the sidelink feedback mini-slots of slot 405 (e.g., mini-slot 410-*b* and mini-slot 410-*d*). In some cases, a set of physical resource blocks may be defined for mini-slot 410-*b* and mini-slot 410-*d*. In some cases, a bitmap (e.g., rbSetPSFCH bitmap, $M_{PRB,set}^{PSFCH}$) may define the set of physical resource blocks for the sidelink feedback mini-slots of slot 405. In some cases, the set of physical resource blocks for the sidelink feedback mini-slots of slot 405 may overlap with the subchannels 415 in the resource pool. In some cases, one or more mini-slots 410 of slot 405 may be time domain multiplexed based on the physical resource blocks overlapping with the subchannels 415. In some cases, the feedback delay 445 may depend on the PSFCH mini-slot periodicity. For example, the UE processing time N1 (e.g., time for PSSCH decoding and feedback preparation) may be less than the number of symbols (e.g., time span of the symbols) in a given mini-slot 410, and hence the UE may be able to provide feedback as soon as the next mini-slot 410 that includes PSFCH.

Figure 5:
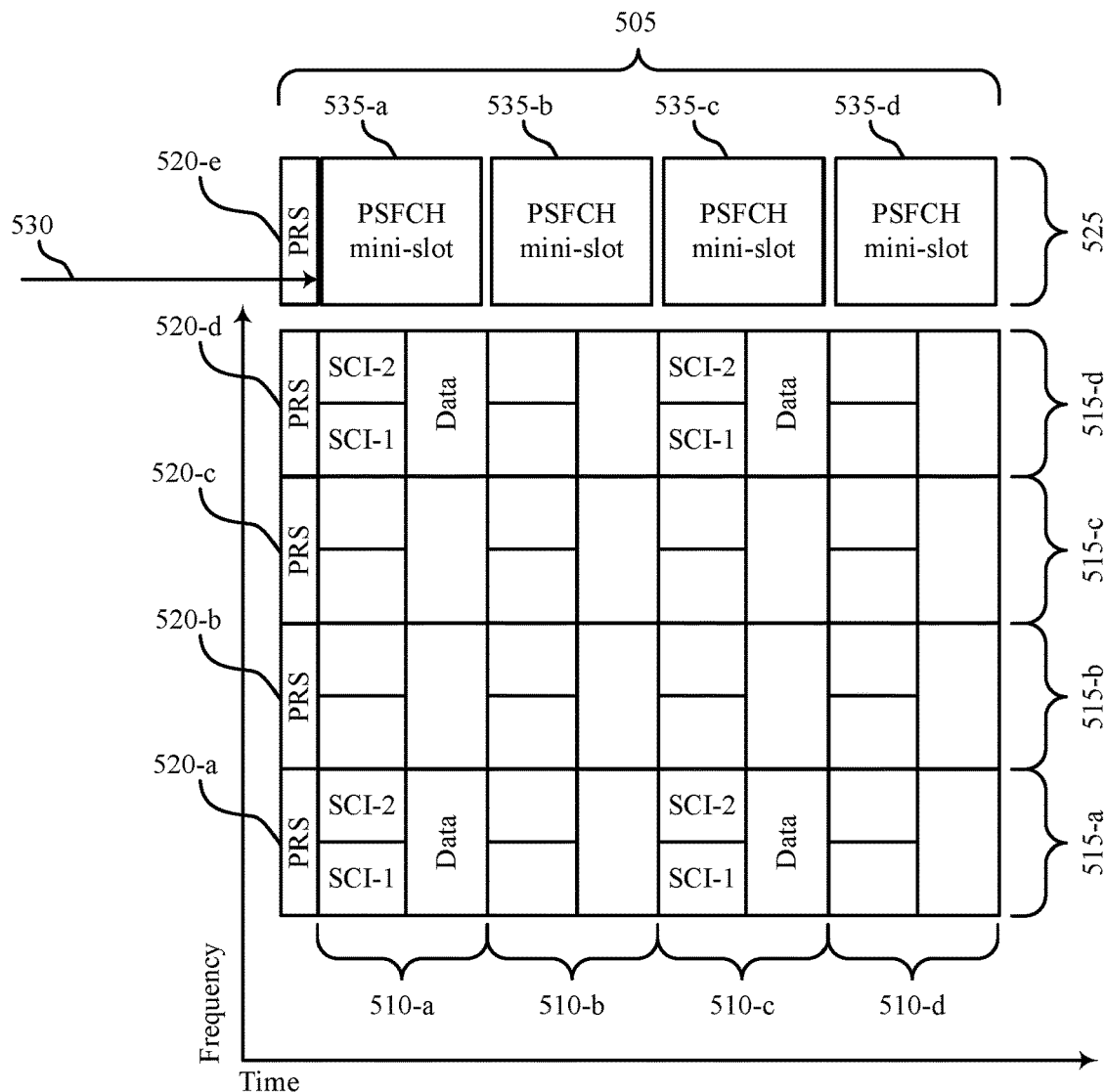
FIG. 5 illustrates an example of an environment that supports short transmission time intervals for sidelink feedback in accordance with aspects of the present disclosure.
Figure 5:
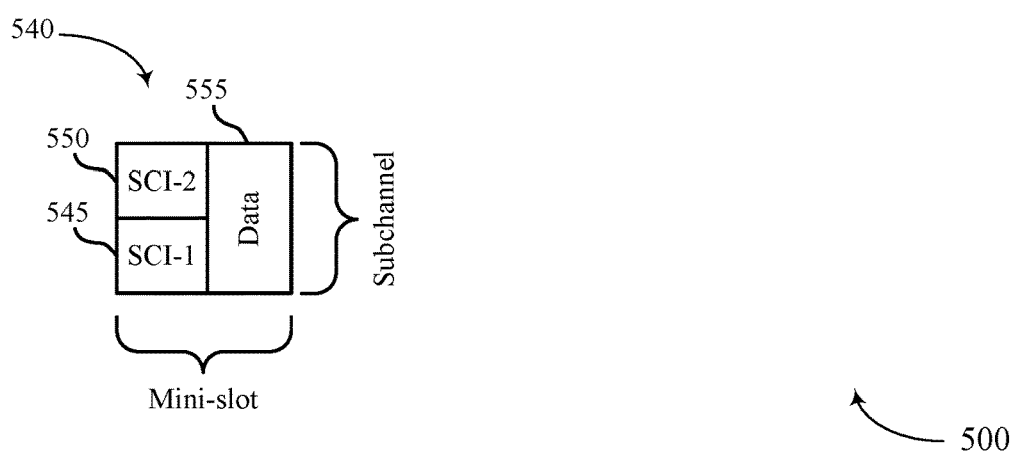

FIG. 5 illustrates an example of an environment 500 that supports short transmission time intervals for sidelink feedback in accordance with aspects of the present disclosure.

In the illustrated example, environment 500 may include slot 505. In some cases, slot 505 may be preceded (e.g., immediately preceded) by power reservation signals 520 (e.g., 520-*a*, 520-*b*, 520-*c*, 520-*d*, 520-*e*). As shown, slot 505 may include mini-slots 510 (e.g., 510-*a*, 510-*b*, 510-*c*, 510-*d*). As shown, each mini-slot 510 of slot 505 may include a sidelink feedback mini-slot 535 (e.g., 535-*a*, 535-*b*, 535-*c*, 535-*d*). In the illustrated example, a location of a mini-slot 535 in slot 505 may be based on a feedback delay 530 that is based on a feedback timing configuration. As shown, mini-slot 510-*a* and mini-slot 510-*c* may each include one or more control data blocks (e.g., control data block 540). In the illustrated example, each control data block 540 may include first sidelink control information 545, second sidelink control information 550, and sidelink data 555. As shown, mini-slots 510-*a* and 510-*c* may each include two control data blocks 540. Thus, environment 400 may be an example in which mini-slots 410 that include PSFCH signaling are frequency-division multiplexed with mini-slots 410 that include SCI signaling, data signaling, or both.

In some examples, sidelink control information may schedule resources of a resource pool (e.g., sidelink feedback resource pool) for the sidelink feedback mini-slots 535 of slot 505. In some cases, a set of physical resource blocks 525 may be defined for mini-slots 535. In some cases, a bitmap (e.g., rbSetPSFCH bitmap, $M_{PRB,set}^{PSFCH}$) may define the set of physical resource blocks 525 for the sidelink feedback mini-slots 535 of slot 505 in a sidelink bandwidth part. In some cases, one or more mini-slots 510 of slot 505 may be frequency domain multiplexed based on one or more control data blocks 540 of a given mini-slot 510 overlapping with a given sidelink feedback mini-slot 535 of the given mini-slot 510. In some cases, non-overlapping physical resource blocks of the set of physical resource blocks 525 may be defined with respect to the subchannels 515 of the resource pool. As shown, PSFCH sidelink feedback mini-slots 535 may be occur in every mini-slot 510 as sidelink feedback mini-slots 535 occupy non-overlapping physical resource blocks with respect to the subchannels 515 of the resource pool. In some cases, the feedback delay 530 may be minimized because PSFCH sidelink feedback mini-slots 535 may be occur in every mini-slot 510. In some cases, the feedback delay 530 may depend on a PSFCH mini-slot periodicity. In some cases, a mini-slot configuration may configure PSFCH mini-slot periodicity in terms of mini-slots (e.g., periodicity of 1/2/4 or X mini-slots).

In some examples, a sidelink feedback resource partition may include one or more physical resource blocks (e.g., a set of physical resource blocks). In some cases, each PSSCH in a given slot and at a given starting subchannel may be mapped to a sidelink feedback channel physical resource block (e.g., PSFCH PRB). In some cases, a first PSSCH in a first slot at a first subchannel may be mapped to a first sidelink feedback channel physical resource block, while a second PSSCH in a second slot at a second subchannel may be mapped to a second sidelink feedback channel physical resource block.

In some examples, a given slot may be allocated a set of sidelink feedback channel physical resource blocks (e.g., PSFCH PRB set). In some cases, a sidelink feedback configuration maps each subchannel of a given slot to Z physical resource blocks, where $Z = M_{subch,slot}^{PSFCH}$ physical resource blocks of the PSFCH PRB set. In some cases, a transmitting sidelink UE may not be allowed to control a PSFCH resource allocation dynamically, but instead PSSCH to PSFCH resource mapping may be based on a formula (e.g., defined by the sidelink feedback configuration). In some cases, a sidelink feedback configuration maps each subchannel in a given slot to $$Z = \frac{M_{PRB,set}^{PSFCH}}{N_{PSSCH}^{PSFCH} \times N_{subch}}$$

physical resource blocks of the PSFCH PRB set, where $M_{PRB,set}^{PSFCH}$ set is the number of physical resource blocks in the PSFCH PRB set, $N_{PSSCH}^{PSFCH}$ is the number of PSSCH slots corresponds to a PSFCH slot, and $N_{subch}$ is the number of subchannels of the given slot. In some cases, in mapping from PSSCH resource to PSFCH PRBs, a sidelink feedback configuration may map time domain resources first and then map frequency domain resources.

In some examples, a slot (e.g., 14-symbol slot) may include multiple data mini-slots (e.g., mini-slot 510-*a*, mini slot 510-*c*) on which UE 115-*a* may receive data or control information, or both. In some cases, each data mini-slot may include one or more short physical sidelink shared channel (sPSSCH). In some cases, UE 115-*a* may send sidelink feedback in response to data that UE 115-*a* receives via one or more data mini-slots. In some cases, physical resource blocks of a mini-slot sidelink feedback channel may be partitioned based on a number of corresponding data mini-slots. In some cases, a given data mini-slot may map to a given sidelink feedback mini-slot.

In some examples, a sidelink feedback mini-slot may be scheduled for data received in a data mini-slot, where feedback on the received data (e.g., sidelink ACK/NACK) may be transmitted based on the resources of the scheduled sidelink feedback mini-slot. In some cases, mini-slot sidelink feedback channel physical resource blocks may be partitioned based on a number of subchannels, or based on a number of associated data mini-slots, or both. In some cases, mini-slot sidelink feedback channel physical resource blocks may be partitioned based on a product of the number of subchannels and the number of associated data mini-slots.

In some examples, a mini-slot may include a block of time resources and a span of frequency resources schedule for sidelink feedback. In some cases, the mini-slot may include a number of symbols of a given slot (e.g., a portion of symbols of a 14-symbol slot) in the time domain and one or more subchannels in the frequency domain. In some cases, each mini-slot may map to an individual sidelink feedback resource partition (e.g., PSFCH partition). In some cases, a first mini-slot may map to a first sidelink feedback resource partition, a second mini-slot may map to a second sidelink feedback resource partition, etc.

In some examples, each mini-slot may map to Z physical resource blocks of a set of physical resource blocks. In some cases, each mini-slot maps to $Z=M_{subch,slot}^{PSFCH}$ physical resource blocks of the set of physical resource blocks, where $M_{subch,slot}^{PSFCH}$ is the number of physical resource blocks in a given sidelink feedback mini-slot. In some cases, each mini-slot maps to $$Z = \frac{M_{PRB,set}^{PSFCH}}{N_{PSSCH}^{PSFCH} \times N_{subch}}$$

physical resource blocks of the set of physical resource blocks, where $M_{PRB,set}^{PSFCH}$ is the quantity of physical resource blocks in the set of physical resource blocks, $N_{sPSSCH}^{PSFCH}$ is a quantity of sPSSCH data mini-slots (e.g., quantity of data mini-slots corresponding to a quantity of PSFCH mini-slots), and $N_{subch}$ is the quantity of subchannels assigned to the sidelink communications. In some cases, UE 115-a may map from PSSCH to PSFCH resources in a time-first-then-frequency fashion (e.g., map time-domain resources first, then map frequency-domain resources).

In some examples, UE 115-a may select a PSFCH resource (e.g., determine an index value corresponding to the PSFCH resource) based on (K+M)mod(Z*Y) for transmitting over one of the Z-PRB partitions corresponding to the leading subchannel of the sPSSCH (e.g., corresponding data mini-slot), where K is a layer 1 source identifier (e.g., 8-bit source identifier), M is a group member identifier, Z is the quantity of physical resource blocks in a sidelink feedback resource partition, and Y is a quantity of cyclic shift pairs per physical resource block. In some cases, M=0 for a unicast transmission, but otherwise equals a corresponding group member identifier.

In some examples, when a format of the sidelink feedback information is based on a PUCCH format 0 waveform, a quantity of PSFCH resources in the sidelink feedback resource partition may be based on a product of the quantity of physical resource blocks (Z) and a quantity of cyclic shift pairs per physical resource block (Y). When a format of the sidelink feedback information is based on a PUCCH format 1 waveform, a quantity of PSFCH resources in the sidelink feedback resource partition may be based on a product of the quantity of physical resource blocks (Z), an orthogonal cover codes spreading factor and a quantity of cyclic shift pairs per physical resource block (Y).

In some examples, a sidelink feedback configuration may map preconfigured cyclic pairs and physical resource blocks of a PSFCH PRB set ($M_{PRB,set}^{PSFCH}$) into PSFCH resource indices and configure one or more sidelink UE receivers with a subset of the PSFCH resource indices. In some cases, to avoid potential collisions, a base station may configure different PSFCH PRB sets for different sidelink UE transmitters (e.g., a first PSFCH PRB set for a first sidelink UE transmitter, a second PSFCH PRB set for a second sidelink UE transmitter, etc.). In some cases, the one or more sidelink UE receivers may be configured via radio resource control (RRC) with a subset of PSFCH resource indices within the PSFCH PRB set that is associated with a sidelink UE transmitter (e.g., to save codepoint for resource indication in sidelink control information). In some cases, the sidelink UE transmitter may signal a feedback delay value (e.g., K1) in terms of mini-slots and mini-slot PSFCH resource indices (e.g., mini-slot M and PSFCH resource index L) in the sidelink control information for a corresponding sidelink UE receiver to enable the sidelink UE receiver to determine where and what to transmit in the indicated PSFCH mini-slot.

Figure 6:
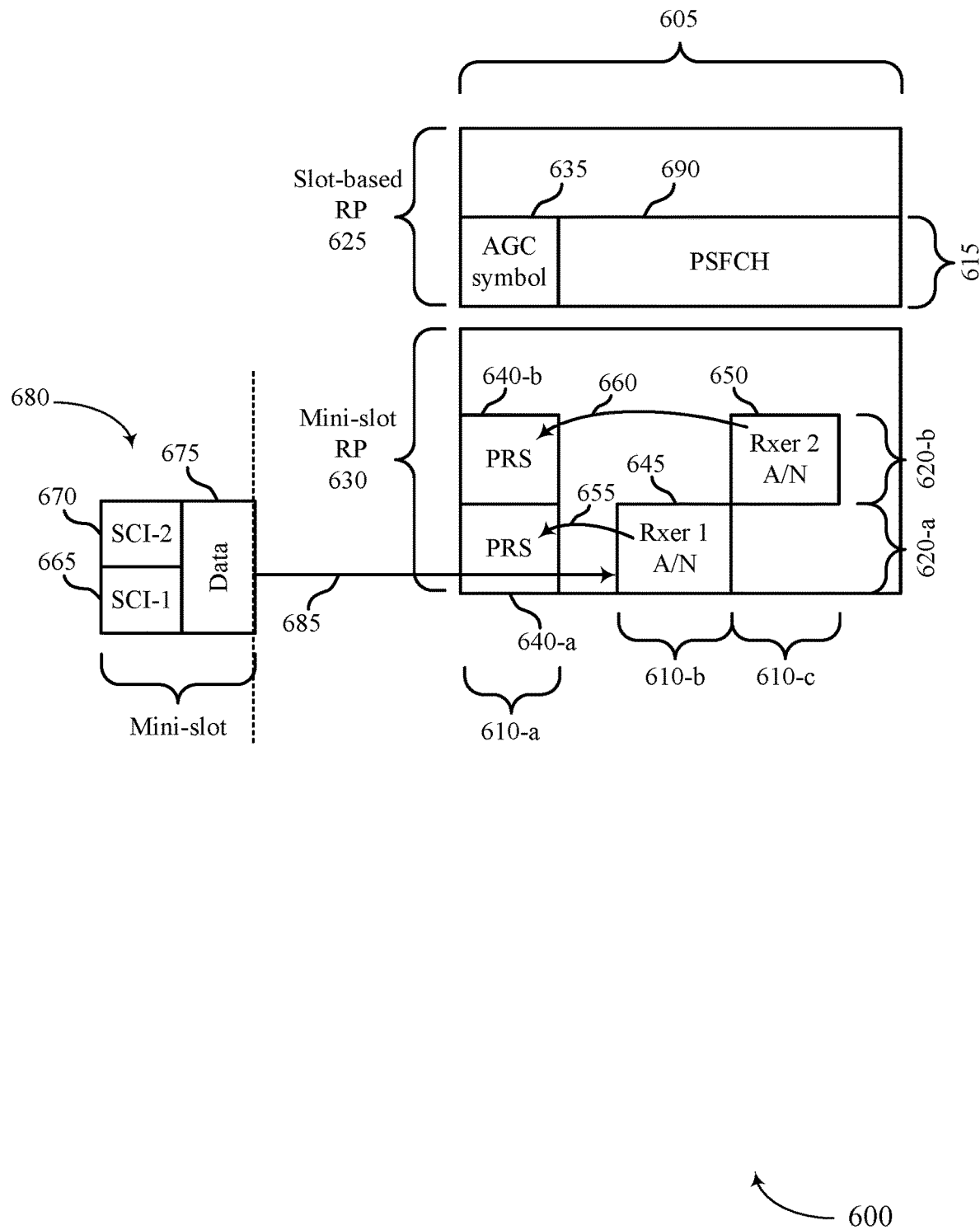
FIG. 6 illustrates an example of an environment that supports short transmission time intervals for sidelink feedback in accordance with aspects of the present disclosure.

FIG. 6 illustrates an example of an environment 600 that supports short transmission time intervals for sidelink feedback in accordance with aspects of the present disclosure.

In the illustrated example, the environment 600 may include slot 605 and control data block 680 (e.g., sPSSCH mini-slot). As shown, control data block 680 may include first sidelink control information 665, second sidelink control information 670, and sidelink data 675. As shown, control data block 680 may be transmitted before a feedback delay 685 (e.g., K1). As shown, slot 605 may include slot-based resource pool 625 for slot-based UEs and mini-slot-based resource pool 630 for mini-slot-based UEs. Environment 600 illustrates an example of a mixed slot/mini-slot configuration with mini-slot-based resource pool and slot-based resource pool 625 overlapping in time in slot 605. As shown, slot 605 may include mini-slots 610 (e.g., 610-a, 610-b, 610-c).

In a mixed deployment configuration, a legacy slot-based sidelink UE receiver may be configured to adjust automatic gain control (AGC) to account for a subsequent mini-slot (e.g., after a first mini-slot). In some cases, the subsequent mini-slot may be from a different sidelink UE transmitter than the sidelink UE transmitter of the first mini-slot. In such cases, the slot-based sidelink UE receiver may not be capable of determining the receive power for subsequent mini-slots when the subsequent mini-slots do not transmit an AGC signal at the initial symbol (e.g., $0^{th}$ symbol, symbol #0) of slot 605.

In the illustrated example, an AGC power reservation signal may be transmitted at mini-slot 610-a (e.g., $0^{th}$ symbol, symbol #0 of slot 605) for a sPSSCH/PSCCH mini-slot that occurs after mini-slot 610-a. In some cases, a sidelink UE transmitter that intends to transmit sPSSCH/PSCCH in a later mini-slot (e.g., after the $0^{th}$ mini-slot) may transmit a reference signal-based (RS-based) power reservation signal (e.g., PRS 640-a, PRS 640-b) at mini-slot 610-a of slot 605. In some cases, a slot-based sidelink UE receiver may estimate the receive power from a nearby sidelink UE transmitter that transmits in later slots. In some cases, the sidelink UE transmitter that intends to transmit PSFCH mini-slot after mini-slot 610-a may send a power reservation signal as well.

In some examples, when an ACK/NACK (e.g., feedback 645, feedback 650) is sent via a PSFCH mini-slot in the first mini-slot, AGC symbol 635 (transmitted during mini-slot 610-a) may serve as AGC training for a slot-based sidelink UE receiver. In some cases, when a sidelink UE receiver receives sPSSCH/PSCCH (e.g., via control data block 680) before mini-slot 610-a (e.g., symbol #0) of slot 605 and the sidelink UE receiver intends to transmit ACK/NACK (e.g., feedback 645, feedback 650) via a PSFCH mini-slot (e.g., mini-slot 610-b, mini-slot 610-c) after mini-slot 610-a, then the sidelink UE receiver may send a power reservation signal (e.g., PRS 640-a, PRS 640-b) during mini-slot 610-a.

When an ACK/NACK occurs during mini-slot 610-*a*, then the sidelink UE receiver may bypass sending the power reservation signal 640.

In some examples, the power reservation signal may be an RS-based signal or a comb-based RS signal. For comb-based RS signals, a comb value for a comb-based RS signal may be based on a location of the sidelink feedback mini-slot within the slot (e.g., based on an index of the sidelink feedback mini-slot). In some cases, each power reservation signal (e.g., PRS 640-*a*, PRS 640-*b*) may take a different comb-based RS signal based on the location of a corresponding sidelink feedback mini-slot within slot 605 where PSFCH sidelink feedback is to be transmitted. As shown, PRS 640-*a* transmitted at mini-slot 610-*a* may take comb 655 corresponding to feedback 645, while PRS 640-*b* transmitted at mini-slot 610-*a* may take comb 660 corresponding to feedback 650.

In some examples, a power reservation signal (e.g., PRS 640-*a*, PRS 640-*b*) may occupy the same location or overlap at least partially in the frequency domain as the associated PSFCH sidelink feedback (e.g., feedback 645, feedback 650). As shown, PRS 650-*a* and feedback 645 may overlap in the frequency domain based on both being transmitted over resource block 620-*a*, and PRS 650-*b* and feedback 650 may overlap in the frequency domain based on both being transmitted over resource block 620-*b*. As shown, AGC symbol 635 may be transmitted within the same subchannel 615 as the sidelink feedback message 690 in the slot-based resource pool 625. In some cases, when an sPSSCH mini-slot (e.g., control data block 680) and a corresponding PSFCH mini-slot (e.g., mini-slot 610-*b*, mini-slot 610-*c*) both occur within the same slot (e.g., slot 605), an AGC power reservation signal (e.g., PRS 640-*a*, PRS 640-*b*) may not be transmitted (e.g., at mini-slot 610-*a*) because a corresponding sidelink UE receiver would not expect to transmit PSFCH sidelink feedback later in slot 605 when the sidelink UE receiver is receiving control/data at symbol #0 of slot 605.

Figure 7:
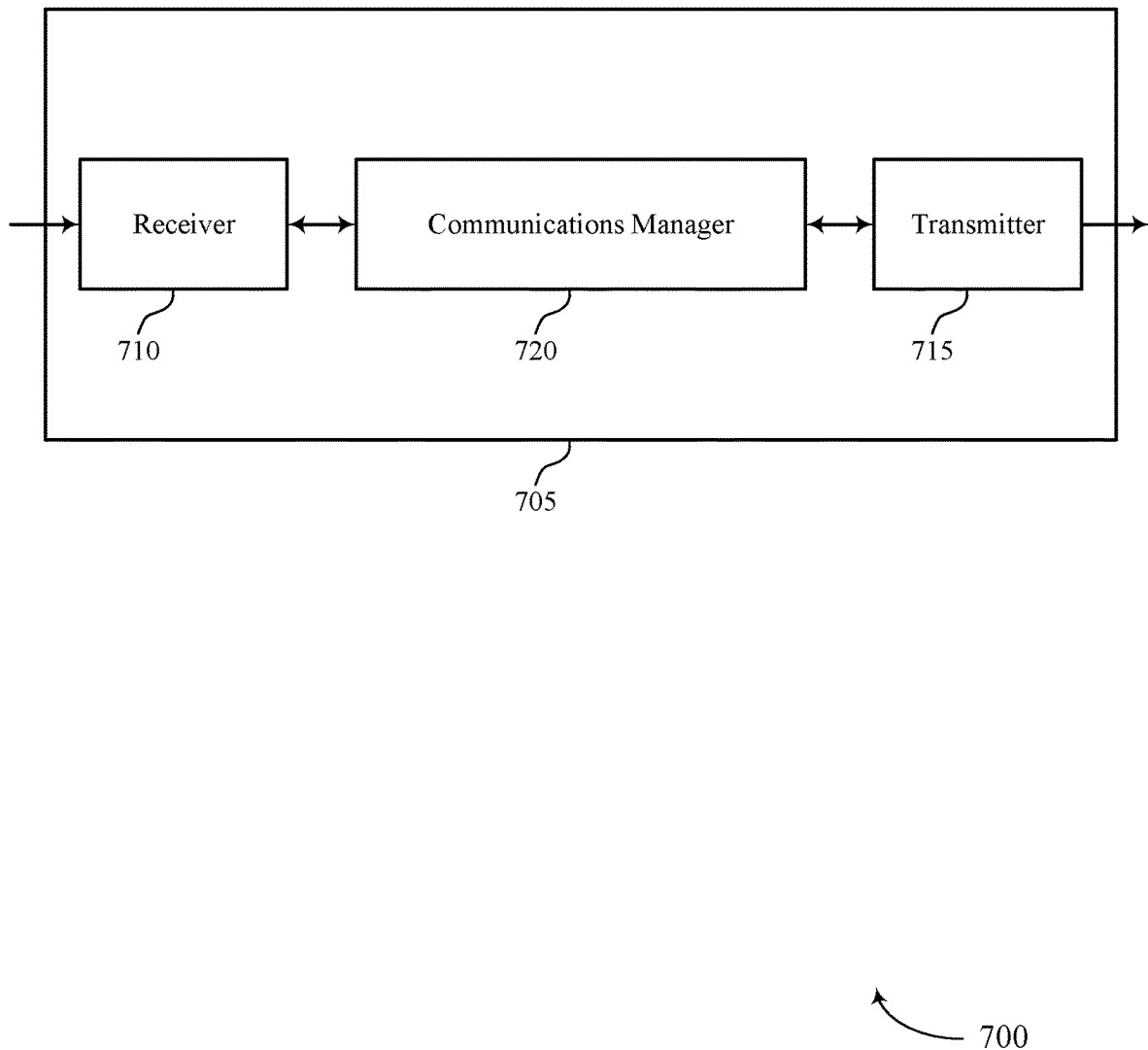
FIGS. 7 and 8 show block diagrams of devices that support short transmission time intervals for sidelink feedback in accordance with aspects of the present disclosure.

FIG. 7 shows a block diagram 700 of a device 705 that supports short transmission time intervals for sidelink feedback in accordance with aspects of the present disclosure. The device 705 may be an example of aspects of a UE 115 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to short transmission time intervals for sidelink feedback). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to short transmission time intervals for sidelink feedback). In some examples, the transmitter 715 may be co-located with a receiver 710 in a transceiver module. The transmitter 715 may utilize a single antenna or a set of multiple antennas.

The communications manager 720, the receiver 710, the transmitter 715, or various combinations thereof or various components thereof may be examples of means for performing various aspects of short transmission time intervals for sidelink feedback as described herein. For example, the communications manager 720, the receiver 710, the transmitter 715, or various combinations or components thereof may support a method for performing one or more of the functions described herein.

In some examples, the communications manager 720, the receiver 710, the transmitter 715, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 720, the receiver 710, the transmitter 715, or various combinations or components thereof may be implemented in code (e.g., as communications management software or firmware) executed by a processor. If implemented in code executed by a processor, the functions of the communications manager 720, the receiver 710, the transmitter 715, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 720 may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communication at a UE in accordance with examples as disclosed herein. For example, the communications manager 720 may be configured as or otherwise support a means for identifying, for a sidelink message scheduled for a first transmission time interval (e.g., a first mini-slot carrying data/control in a first 14-symbol slot), a second transmission time interval (e.g., a second mini-slot in a second 14-symbol slot occurring chronologically after the first slot) for transmitting a sidelink feedback message corresponding to the sidelink message transmitting in the first transmission time interval, where the first transmission time interval and the second transmission time interval are both shorter in duration than a third transmission time interval (e.g., the second slot) that includes the second transmission time interval. The communications manager 720 may be configured as or otherwise support a means for transmitting automatic gain control information in a first symbol period of the second transmission time interval. The communications manager 720 may be configured as or otherwise support a means for transmitting the sidelink feedback message in a second symbol period of the second transmission time interval that occurs chronologically after the first symbol period of the second transmission time interval. The communications manager 720 may be configured as or otherwise support a means for switching from operating the UE in a transmitting mode to operating the UE in a receiving mode during a third symbol period of the second transmission time interval that occurs chronologically after the second symbol period of the second transmission time interval.

By including or configuring the communications manager 720 in accordance with examples as described herein, the device 705 (e.g., a processor controlling or otherwise coupled to the receiver 710, the transmitter 715, the communications manager 720, or a combination thereof) may support techniques for increasing system efficiency such that a device may decrease latency associated with sidelink feedback channel (e.g., ACK/NACK feedback). Additionally, described techniques may result in reduced processing, reduced power consumption, more efficient utilization of communication resources.

Figure 8:
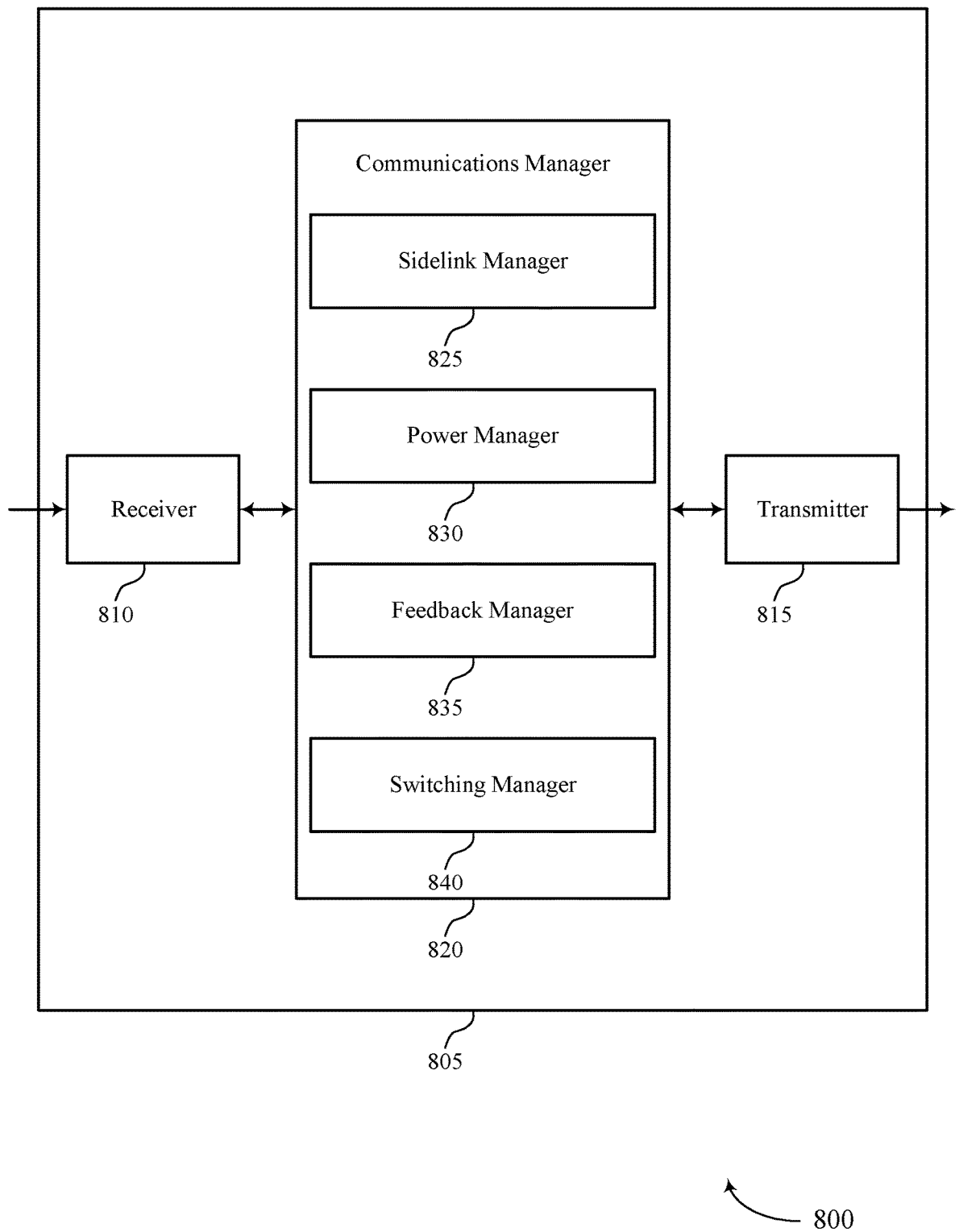

FIG. 8 shows a block diagram 800 of a device 805 that supports short transmission time intervals for sidelink feedback in accordance with aspects of the present disclosure. The device 805 may be an example of aspects of a device 705 or a UE 115 as described herein. The device 805 may include a receiver 810, a transmitter 815, and a communications manager 820. The device 805 may also include a processor. Each of these components may be in communication with one another (e.g., via one or more buses).

The receiver 810 may provide a means for receiving information such as packets, user data, control information, or any combination thereof associated with various information channels (e.g., control channels, data channels, information channels related to short transmission time intervals for sidelink feedback). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to short transmission time intervals for sidelink feedback). In some examples, the transmitter 815 may be co-located with a receiver 810 in a transceiver module. The transmitter 815 may utilize a single antenna or a set of multiple antennas.

The device 805, or various components thereof, may be an example of means for performing various aspects of short transmission time intervals for sidelink feedback as described herein. For example, the communications manager 820 may include a sidelink manager 825, a power manager 830, a feedback manager 835, a switching manager 840, or any combination thereof. The communications manager 820 may be an example of aspects of a communications manager 720 as described herein. In some examples, the communications manager 820, or various components thereof, may be configured to perform various operations (e.g., receiving, monitoring, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to receive information, transmit information, or perform various other operations as described herein.

The communications manager 820 may support wireless communication at a UE in accordance with examples as disclosed herein. The sidelink manager 825 may be configured as or otherwise support a means for identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval. The power manager 830 may be configured as or otherwise support a means for transmitting automatic gain control information in a first symbol period of the second transmission time interval. The feedback manager 835 may be configured as or otherwise support a means for transmitting the sidelink feedback message in a second symbol period of the second transmission time interval that occurs chronologically after the first symbol period of the second transmission time interval. The switching manager 840 may be configured as or otherwise support a means for switching from operating the UE in a transmitting mode to operating the UE in a receiving mode during a third symbol period of the second transmission time interval that occurs chronologically after the second symbol period of the second transmission time interval.

Figure 9:
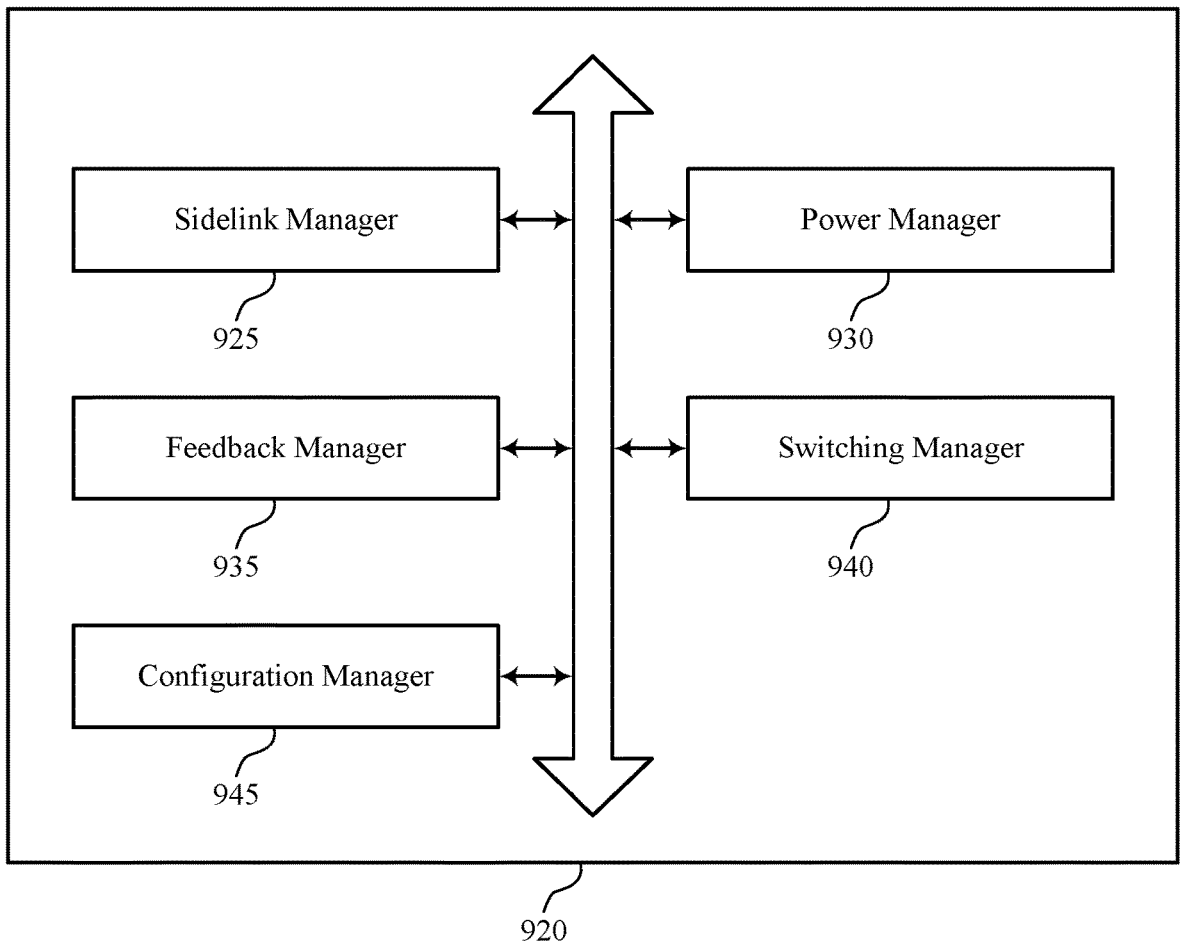
FIG. 9 shows a block diagram of a communications manager that supports short transmission time intervals for sidelink feedback in accordance with aspects of the present disclosure.

FIG. 9 shows a block diagram 900 of a communications manager 920 that supports short transmission time intervals for sidelink feedback in accordance with aspects of the present disclosure. The communications manager 920 may be an example of aspects of a communications manager 720, a communications manager 820, or both, as described herein. The communications manager 920, or various components thereof, may be an example of means for performing various aspects of short transmission time intervals for sidelink feedback as described herein. For example, the communications manager 920 may include a sidelink manager 925, a power manager 930, a feedback manager 935, a switching manager 940, a configuration manager 945, or any combination thereof. Each of these components may communicate, directly or indirectly, with one another (e.g., via one or more buses).

The communications manager 920 may support wireless communication at a UE in accordance with examples as disclosed herein. The sidelink manager 925 may be configured as or otherwise support a means for identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval. The power manager 930 may be configured as or otherwise support a means for transmitting automatic gain control information in a first symbol period of the second transmission time interval. The feedback manager 935 may be configured as or otherwise support a means for transmitting the sidelink feedback message in a second symbol period of the second transmission time interval that occurs chronologically after the first symbol period of the second transmission time interval. The switching manager 940 may be configured as or otherwise support a means for switching from operating the UE in a transmitting mode to operating the UE in a receiving mode during a third symbol period of the second transmission time interval that occurs chronologically after the second symbol period of the second transmission time interval.

In some examples, the first symbol period includes an initial symbol of the second transmission time interval. In some examples, the third symbol period includes a final symbol of the second transmission time interval. In some examples, the second symbol period includes one or more symbols, the one or more symbols including each symbol of the second transmission time interval between the initial symbol and the final symbol.

In some examples, the configuration manager 945 may be configured as or otherwise support a means for receiving configuration signaling that indicates, for a set of multiple consecutive transmission time intervals that includes the second transmission time interval, that a first subchannel is allocated to sidelink feedback messages and a second subchannel different than the first subchannel is allocated to sidelink data or control information.

In some examples, the feedback manager 935 may be configured as or otherwise support a means for receiving a bitmap that indicates a set of physical resource blocks for carrying sidelink feedback messages within a sidelink bandwidth part, where the sidelink feedback message is transmitted via one or more physical resource blocks of the set of physical resource blocks. In some examples, the sidelink feedback message is transmitted based on a physical control channel format 0 based on the second symbol period including three or fewer symbols. In some examples, the sidelink feedback message is transmitted based on a physical control channel format 1 based on the second symbol period including at least four symbols.

In some examples, when a format of the sidelink feedback message is based on a physical uplink control channel format 0 waveform, a quantity of sidelink feedback resources within the sidelink feedback resource partition is based on the quantity of physical resource blocks and a quantity of cyclic shift pairs per physical resource block of the set of physical resource blocks. In some examples, when a format of the sidelink feedback message is based on a physical uplink control channel format 1 waveform, a quantity of sidelink feedback resources within the sidelink feedback resource partition is based on the quantity of physical resource blocks, an orthogonal code spreading factor, and a quantity of cyclic shift pairs per physical resource block of the set of physical resource blocks.

In some examples, the third transmission time interval includes a set of multiple transmission time intervals, the second transmission time interval and a fourth transmission time interval included in the set of multiple transmission time intervals. In some examples, the sidelink feedback message is transmitted within a subchannel that is allocated for sidelink data or control information during the fourth transmission time interval.

In some examples, the feedback manager 935 may be configured as or otherwise support a means for receiving an indication of a periodicity for a resource pool that includes the set of multiple transmission time intervals, where a subset of one or more transmission time intervals are allocated for sidelink feedback messages within the set of multiple transmission time intervals based on the periodicity.

In some examples, the feedback manager 935 may be configured as or otherwise support a means for receiving a bitmap that indicates a set of physical resource blocks for carrying the sidelink feedback message within the second symbol period, where the sidelink feedback message is transmitted via one or more physical resource blocks of the set of physical resource blocks.

In some examples, the feedback manager 935 may be configured as or otherwise support a means for receiving a subset of sidelink feedback resource indices of a set of multiple sidelink feedback resource indices, where the set of multiple sidelink feedback resource indices are mapped to a set of multiple cyclic shift pairs and a set of multiple physical resource blocks, and where the sidelink feedback message is transmitted via one or more physical resource blocks and using a cyclic shift pair corresponding to one of the subset of sidelink feedback resource indices.

In some examples, the feedback manager 935 may be configured as or otherwise support a means for receiving a feedback delay value that indicates a location of the second transmission time interval within the third transmission time interval.

In some examples, the power manager 930 may be configured as or otherwise support a means for transmitting a power reservation signal in an initial symbol of the third transmission time interval based on the first transmission time interval in which the sidelink message is scheduled being before the third transmission time interval that includes the second transmission time interval.

In some examples, the power reservation signal is based on a reference signal. In some examples, the reference signal includes a comb-based reference signal. In some examples, a comb value for the reference signal is based on a location of the second transmission time interval within the third transmission time interval. In some examples, the power reservation signal is transmitted within a same resource block location in a frequency domain as the sidelink feedback message.

In some examples, the feedback manager 935 may be configured as or otherwise support a means for selecting a physical resource block of the set of physical resource blocks for transmitting the sidelink feedback message based on a time-first-then-frequency mapping between resources allocated to the sidelink messages and the set of physical resource blocks.

In some examples, the feedback manager 935 may be configured as or otherwise support a means for selecting a sidelink feedback resource within the sidelink feedback resource partition based on a first value modulo a second value, where the first value is based on a sum of a layer 1 source identifier and a group member identifier associated with the sidelink message, where the second value is based on a product of the quantity of physical resource blocks and a quantity of cyclic shift pairs per physical resource block of the set of physical resource blocks, and where the sidelink feedback message is transmitted via the selected sidelink feedback resource.

In some examples, a sidelink feedback resource partition includes a set of physical resource blocks. In some examples, a quantity of physical resource blocks within the set of physical resource blocks is based on a second quantity of physical resource blocks allocated for sidelink feedback messages within the second transmission time interval, a quantity of transmission time intervals allocated to sidelink messages and corresponding to the second transmission time interval, a quantity of subchannels included in the sidelink feedback resource partition, or any combination thereof.

In some examples, to support transmitting the sidelink feedback message in the second symbol period, the feedback manager 935 may be configured as or otherwise support a means for transmitting a waveform in an initial symbol of the second symbol period. In some examples, to support transmitting the sidelink feedback message in the second symbol period, the feedback manager 935 may be configured as or otherwise support a means for transmitting a respective repetition of the waveform in each additional symbol of the second symbol period.

In some examples, the feedback manager 935 may be configured as or otherwise support a means for selecting the second transmission time interval to transmit the sidelink feedback message based on a feedback timing configuration and a timing of the second transmission time interval relative to the first transmission time interval. In some examples, the feedback timing configuration is based on a fixed feedback timeline, a feedback delay value indicated in sidelink control information received by the UE, or both.

Figure 10:
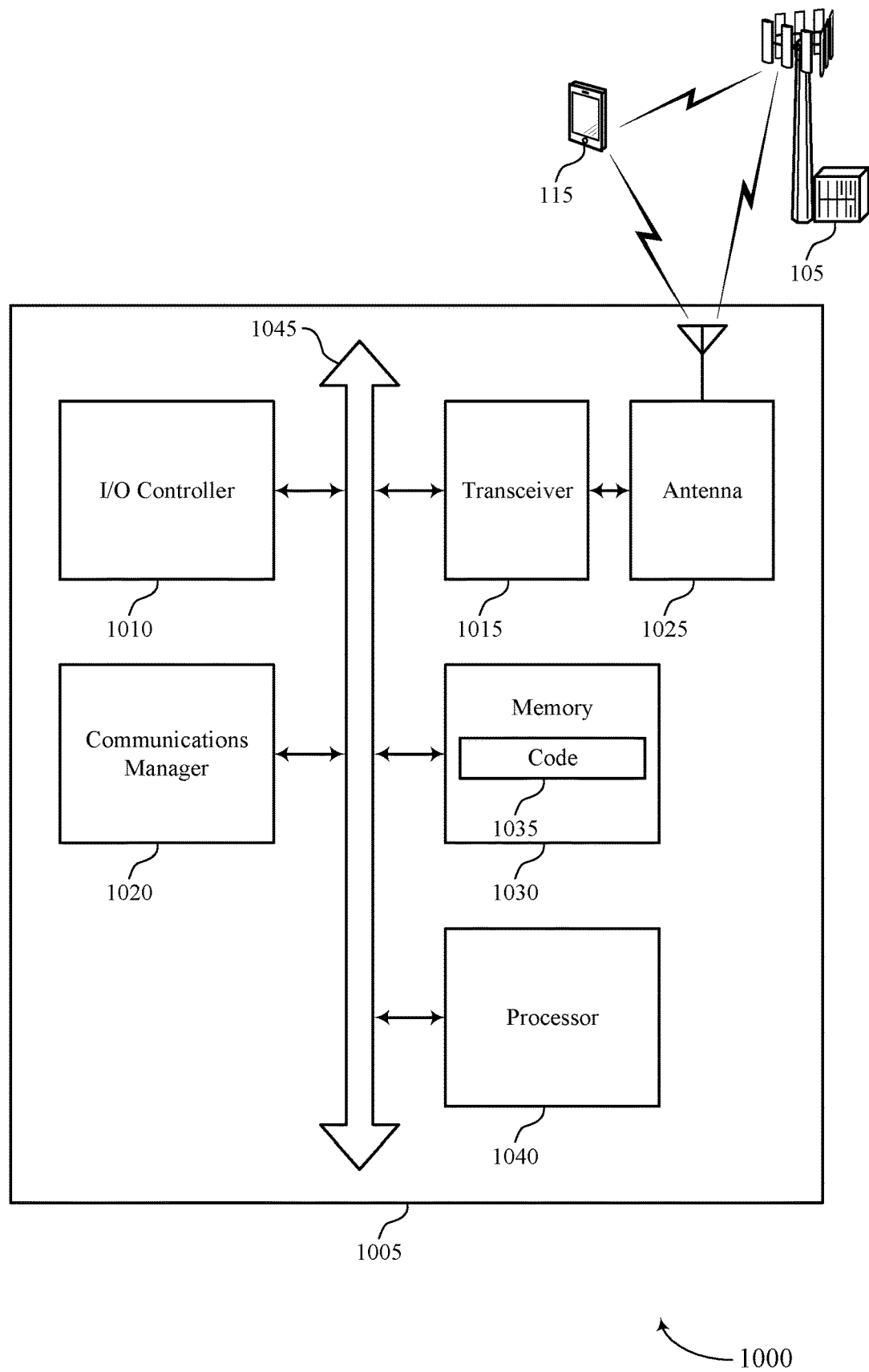
FIG. 10 shows a diagram of a system including a device that supports short transmission time intervals for sidelink feedback in accordance with aspects of the present disclosure.

FIG. 10 shows a diagram of a system 1000 including a device 1005 that supports short transmission time intervals for sidelink feedback in accordance with aspects of the present disclosure. The device 1005 may be an example of or include the components of a device 705, a device 805, or a UE 115 as described herein. The device 1005 may communicate wirelessly with one or more base stations 105, UEs 115, or any combination thereof. The device 1005 may include components for bi-directional voice and data communications including components for transmitting and receiving communications, such as a communications manager 1020, an input/output (I/O) controller 1010, a transceiver 1015, an antenna 1025, a memory 1030, code 1035, and a processor 1040. These components may be in electronic communication or otherwise coupled (e.g., operatively, communicatively, functionally, electronically, electrically) via one or more buses (e.g., a bus 1045).

The I/O controller 1010 may manage input and output signals for the device 1005. The I/O controller 1010 may also manage peripherals not integrated into the device 1005. In some cases, the I/O controller 1010 may represent a physical connection or port to an external peripheral. In some cases, the I/O controller 1010 may utilize an operating system such as iOS™, ANDROID®, MS-DOS®, MS-WINDOWS®, OS/2®, UNIX®, LINUX®, or another known operating system. Additionally or alternatively, the I/O controller 1010 may represent or interact with a modem, a keyboard, a mouse, a touchscreen, or a similar device. In some cases, the I/O controller 1010 may be implemented as part of a processor, such as the processor 1040. In some cases, a user may interact with the device 1005 via the I/O controller 1010 or via hardware components controlled by the I/O controller 1010.

In some cases, the device 1005 may include a single antenna 1025. However, in some other cases, the device 1005 may have more than one antenna 1025, which may be capable of concurrently transmitting or receiving multiple wireless transmissions. The transceiver 1015 may communicate bi-directionally, via the one or more antennas 1025, wired, or wireless links as described herein. For example, the transceiver 1015 may represent a wireless transceiver and may communicate bi-directionally with another wireless transceiver. The transceiver 1015 may also include a modem to modulate the packets, to provide the modulated packets to one or more antennas 1025 for transmission, and to demodulate packets received from the one or more antennas 1025. The transceiver 1015, or the transceiver 1015 and one or more antennas 1025, may be an example of a transmitter 715, a transmitter 815, a receiver 710, a receiver 810, or any combination thereof or component thereof, as described herein.

The memory 1030 may include random access memory (RAM) and read-only memory (ROM). The memory 1030 may store computer-readable, computer-executable code 1035 including instructions that, when executed by the processor 1040, cause the device 1005 to perform various functions described herein. The code 1035 may be stored in a non-transitory computer-readable medium such as system memory or another type of memory. In some cases, the code 1035 may not be directly executable by the processor 1040 but may cause a computer (e.g., when compiled and executed) to perform functions described herein. In some cases, the memory 1030 may contain, among other things, a basic I/O system (BIOS) which may control basic hardware or software operation such as the interaction with peripheral components or devices.

The processor 1040 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In some other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting short transmission time intervals for sidelink feedback). For example, the device 1005 or a component of the device 1005 may include a processor 1040 and memory 1030 coupled to the processor 1040, the processor 1040 and memory 1030 configured to perform various functions described herein.

The communications manager 1020 may support wireless communication at a UE in accordance with examples as disclosed herein. For example, the communications manager 1020 may be configured as or otherwise support a means for identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval. The communications manager 1020 may be configured as or otherwise support a means for transmitting automatic gain control information in a first symbol period of the second transmission time interval. The communications manager 1020 may be configured as or otherwise support a means for transmitting the sidelink feedback message in a second symbol period of the second transmission time interval that occurs chronologically after the first symbol period of the second transmission time interval. The communications manager 1020 may be configured as or otherwise support a means for switching from operating the UE in a transmitting mode to operating the UE in a receiving mode during a third symbol period of the second transmission time interval that occurs chronologically after the second symbol period of the second transmission time interval.

By including or configuring the communications manager 1020 in accordance with examples as described herein, the device 1005 may support techniques for increasing system efficiency such that a device may decrease latency associated with sidelink feedback channel (e.g., ACK/NACK feedback). Additionally, described techniques may result in improved communication reliability, reduced latency, improved user experience related to reduced processing, reduced power consumption, more efficient utilization of communication resources, improved coordination between devices, longer battery life, improved utilization of processing capability.

In some examples, the communications manager 1020 may be configured to perform various operations (e.g., receiving, monitoring, transmitting) using or otherwise in cooperation with the transceiver 1015, the one or more antennas 1025, or any combination thereof. Although the communications manager 1020 is illustrated as a separate component, in some examples, one or more functions described with reference to the communications manager 1020 may be supported by or performed by the processor 1040, the memory 1030, the code 1035, or any combination thereof. For example, the code 1035 may include instructions executable by the processor 1040 to cause the device 1005 to perform various aspects of short transmission time intervals for sidelink feedback as described herein, or the processor 1040 and the memory 1030 may be otherwise configured to perform or support such operations.

Figure 11:
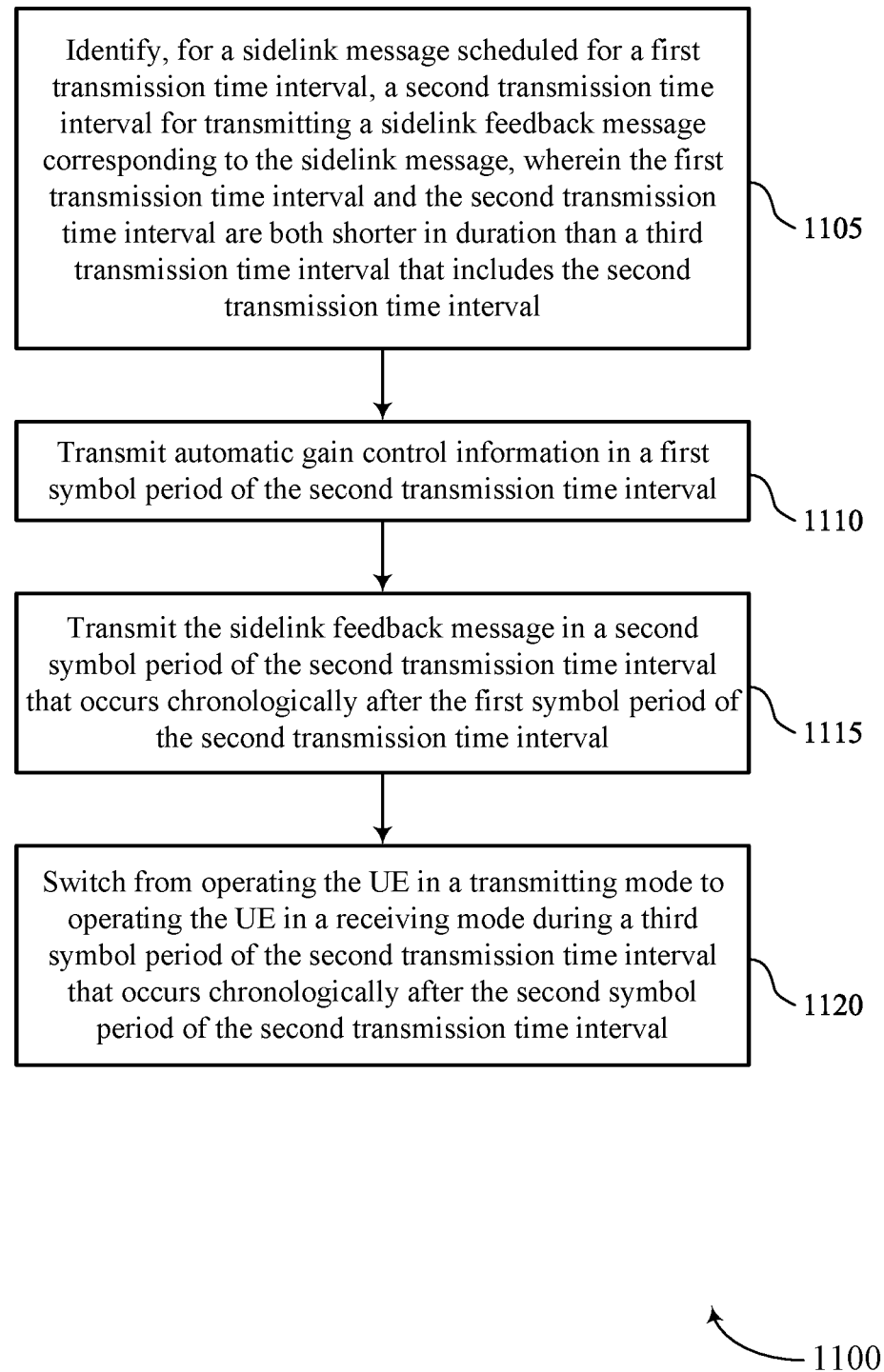
FIGS. 11 and 12 show flowcharts illustrating methods that support short transmission time intervals for sidelink feedback in accordance with aspects of the present disclosure.

FIG. 11 shows a flowchart illustrating a method 1100 that supports short transmission time intervals for sidelink feedback in accordance with aspects of the present disclosure. The operations of the method 1100 may be implemented by a UE or its components as described herein. For example, the operations of the method 1100 may be performed by a UE 115 as described with reference to FIGS. 1 through 10. In some examples, a UE may execute a set of instructions to control the functional elements of the UE to perform the described functions. Additionally or alternatively, the UE may perform aspects of the described functions using special-purpose hardware.

At 1105, the method may include identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval. The operations of 1105 may be performed in accordance with examples as disclosed herein. In some examples, aspects of the operations of 1105 may be performed by a sidelink manager 925 as described with reference to FIG. 9.

At 1110, the method may include transmitting automatic gain control information in a first symbol period of the second transmission time interval. The operations of 1110 may be performed in accordance with examples as disclosed herein. In some examples, aspects of the operations of 1110 may be performed by a power manager 930 as described with reference to FIG. 9.

At 1115, the method may include transmitting the sidelink feedback message in a second symbol period of the second transmission time interval that occurs chronologically after the first symbol period of the second transmission time interval. The operations of 1115 may be performed in accordance with examples as disclosed herein. In some examples, aspects of the operations of 1115 may be performed by a feedback manager 935 as described with reference to FIG. 9.

At 1120, the method may include switching from operating the UE in a transmitting mode to operating the UE in a receiving mode during a third symbol period of the second transmission time interval that occurs chronologically after the second symbol period of the second transmission time interval. The operations of 1120 may be performed in accordance with examples as disclosed herein. In some examples, aspects of the operations of 1120 may be performed by a switching manager 940 as described with reference to FIG. 9.

Figure 12:
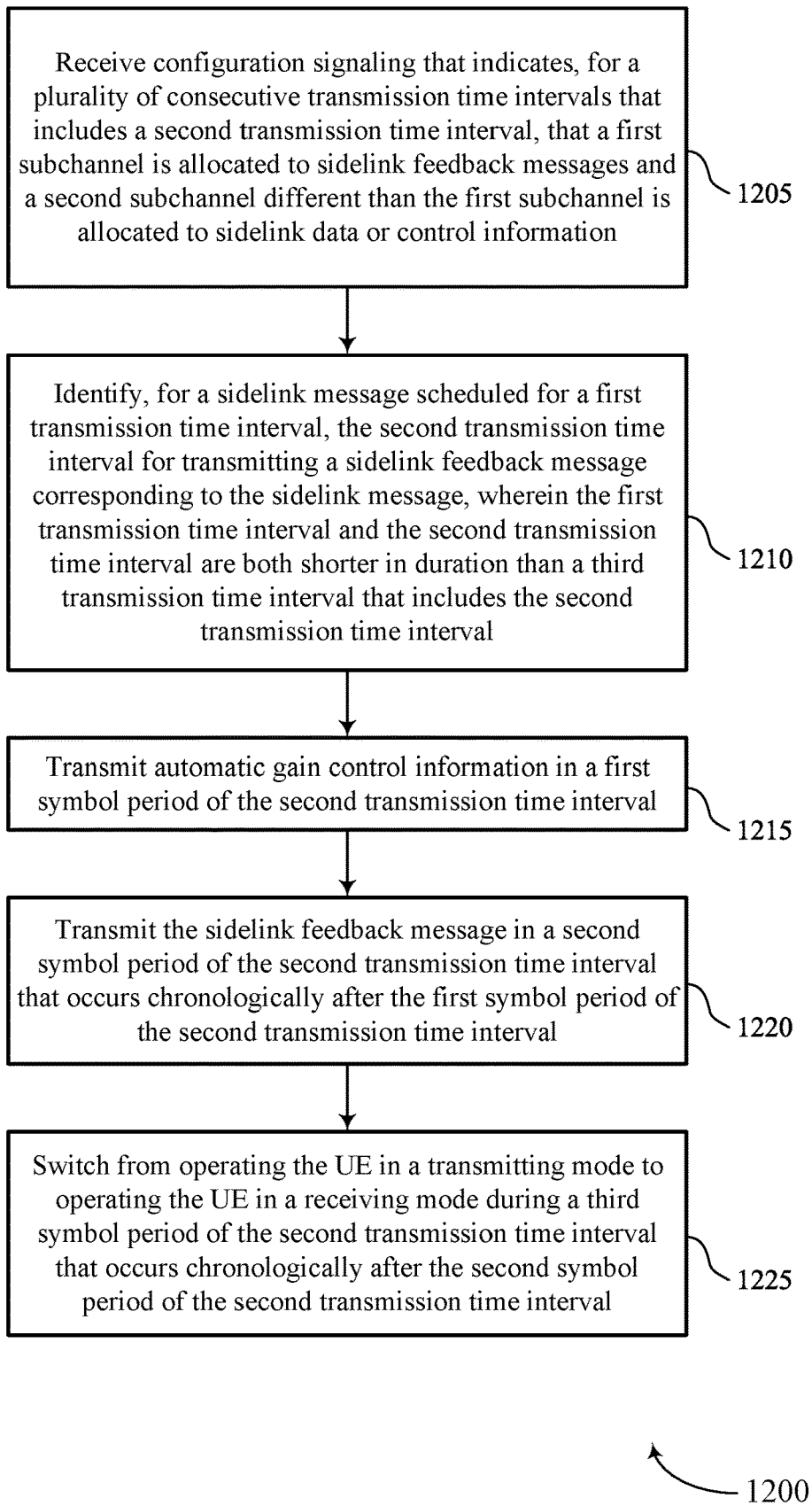

FIG. 12 shows a flowchart illustrating a method 1200 that supports short transmission time intervals for sidelink feedback in accordance with aspects of the present disclosure. The operations of the method 1200 may be implemented by a UE or its components as described herein. For example, the operations of the method 1200 may be performed by a UE 115 as described with reference to FIGS. 1 through 10. In some examples, a UE may execute a set of instructions to control the functional elements of the UE to perform the described functions. Additionally or alternatively, the UE may perform aspects of the described functions using special-purpose hardware.

At 1205, the method may include identifying, for a sidelink message scheduled for a first transmission time interval, a second transmission time interval for transmitting a sidelink feedback message corresponding to the sidelink message, where the first transmission time interval and the second transmission time interval are both shorter in duration than a third transmission time interval that includes the second transmission time interval. The operations of 1205 may be performed in accordance with examples as disclosed herein. In some examples, aspects of the operations of 1205 may be performed by a sidelink manager 925 as described with reference to FIG. 9.

At 1210, the method may include transmitting automatic gain control information in a first symbol period of the second transmission time interval. The operations of 1210 may be performed in accordance with examples as disclosed herein. In some examples, aspects of the operations of 1210 may be performed by a power manager 930 as described with reference to FIG. 9.

At 1215, the method may include transmitting the sidelink feedback message in a second symbol period of the second transmission time interval that occurs chronologically after the first symbol period of the second transmission time interval. The operations of 1215 may be performed in accordance with examples as disclosed herein. In some examples, aspects of the operations of 1215 may be performed by a feedback manager 935 as described with reference to FIG. 9.

At 1220, the method may include switching from operating the UE in a transmitting mode to operating the UE in a receiving mode during a third symbol period of the second transmission time interval that occurs chronologically after the second symbol period of the second transmission time interval. The operations of 1220 may be performed in accordance with examples as disclosed herein. In some examples, aspects of the operations of 1220 may be performed by a switching manager 940 as described with reference to FIG. 9.

At 1225, the method may include receiving configuration signaling that indicates, for a set of multiple consecutive transmission time intervals that includes the second transmission time interval, that a first subchannel is allocated to sidelink feedback messages and a second subchannel different than the first subchannel is allocated to sidelink data or control information. The operations of 1225 may be performed in accordance with examples as disclosed herein. In some examples, aspects of the operations of 1225 may be performed by a configuration manager 945 as described with reference to FIG. 9.

The following provides an overview of aspects of the present disclosure:

Aspect 1: A method for wireless communication at a UE, comprising: identifying, for a sidelink message scheduled for a first transmission time interval, a second transmission time interval for transmitting a sidelink feedback message corresponding to the sidelink message, wherein the first transmission time interval and the second transmission time interval are both shorter in duration than a third transmission time interval that includes the second transmission time interval; transmitting automatic gain control information in a first symbol period of the second transmission time interval; transmitting the sidelink feedback message in a second symbol period of the second transmission time interval that occurs chronologically after the first symbol period of the second transmission time interval; and switching from operating the UE in a transmitting mode to operating the UE in a receiving mode during a third symbol period of the second transmission time interval that occurs chronologically after the second symbol period of the second transmission time interval.

Aspect 2: The method of aspect 1, further comprising: receiving configuration signaling that indicates, for a plurality of consecutive transmission time intervals that includes the second transmission time interval, that a first subchannel is allocated to sidelink feedback messages and a second subchannel different than the first subchannel is allocated to sidelink data or control information.

Aspect 3: The method of any of aspects 1 through 2, further comprising: receiving a bitmap that indicates a set of physical resource blocks for carrying sidelink feedback messages within a sidelink bandwidth part, wherein the sidelink feedback message is transmitted via one or more physical resource blocks of the set of physical resource blocks.

Aspect 4: The method of any of aspects 1 through 3, wherein the third transmission time interval comprises a plurality of transmission time intervals, the second transmission time interval and a fourth transmission time interval included in the plurality of transmission time intervals; and the sidelink feedback message is transmitted within a subchannel that is allocated for sidelink data or control information during the fourth transmission time interval.

Aspect 5: The method of aspect 4, further comprising: receiving an indication of a periodicity for a resource pool that comprises the plurality of transmission time intervals, wherein a subset of one or more transmission time intervals are allocated for sidelink feedback messages within the plurality of transmission time intervals based at least in part on the periodicity.

Aspect 6: The method of any of aspects 1 through 5, further comprising: receiving a bitmap that indicates a set of physical resource blocks for carrying the sidelink feedback message within the second symbol period, wherein the sidelink feedback message is transmitted via one or more physical resource blocks of the set of physical resource blocks.

Aspect 7: The method of any of aspects 1 through 6, further comprising: receiving a subset of sidelink feedback resource indices of a plurality of sidelink feedback resource indices, wherein the plurality of sidelink feedback resource indices are mapped to a plurality of cyclic shift pairs and a plurality of physical resource blocks, and wherein the sidelink feedback message is transmitted via one or more physical resource blocks and using a cyclic shift pair corresponding to one of the subset of sidelink feedback resource indices.

Aspect 8: The method of any of aspects 1 through 7, further comprising: receiving a feedback delay value that indicates a location of the second transmission time interval within the third transmission time interval.

Aspect 9: The method of any of aspects 1 through 8, further comprising: transmitting a power reservation signal in an initial symbol of the third transmission time interval based at least in part on the first transmission time interval in which the sidelink message is scheduled being before the third transmission time interval that includes the second transmission time interval.

Aspect 10: The method of aspect 9, wherein the power reservation signal is based at least in part on a reference signal.

Aspect 11: The method of aspect 10, wherein the reference signal comprises a comb-based reference signal, and a comb value for the reference signal is based at least in part on a location of the second transmission time interval within the third transmission time interval.

Aspect 12: The method of any of aspects 9 through 11, wherein the power reservation signal is transmitted within a same resource block location in a frequency domain as the sidelink feedback message.

Aspect 13: The method of any of aspects 1 through 12, wherein a sidelink feedback resource partition comprises a set of physical resource blocks, and a quantity of physical resource blocks within the set of physical resource blocks is based at least in part on a second quantity of physical resource blocks allocated for sidelink feedback messages within the second transmission time interval, a quantity of transmission time intervals allocated to sidelink messages and corresponding to the second transmission time interval, a quantity of subchannels included in the sidelink feedback resource partition, or any combination thereof.

Aspect 14: The method of aspect 13, further comprising: selecting a physical resource block of the set of physical resource blocks for transmitting the sidelink feedback message based at least in part on a time-first-then-frequency mapping between resources allocated to the sidelink messages and the set of physical resource blocks.

Aspect 15: The method of any of aspects 13 through 14, wherein when a format of the sidelink feedback message is based at least in part on a physical uplink control channel format 0 waveform, a quantity of sidelink feedback resources within the sidelink feedback resource partition is based at least in part on the quantity of physical resource blocks and a quantity of cyclic shift pairs per physical resource block of the set of physical resource blocks.

Aspect 16: The method of any of aspects 13 through 15, wherein when a format of the sidelink feedback message is based at least in part on a physical uplink control channel format 1 waveform, a quantity of sidelink feedback resources within the sidelink feedback resource partition is based at least in part on the quantity of physical resource blocks, an orthogonal code spreading factor, and a quantity of cyclic shift pairs per physical resource block of the set of physical resource blocks.

Aspect 17: The method of any of aspects 13 through 16, further comprising: selecting a sidelink feedback resource within the sidelink feedback resource partition based at least in part on a first value modulo a second value, wherein the first value is based at least in part on a sum of a layer 1 source identifier and a group member identifier associated with the sidelink message, wherein the second value is based at least in part on a product of the quantity of physical resource blocks and a quantity of cyclic shift pairs per physical resource block of the set of physical resource blocks, and wherein the sidelink feedback message is transmitted via the selected sidelink feedback resource.

Aspect 18: The method of any of aspects 1 through 17, wherein the sidelink feedback message is transmitted based at least in part on a physical control channel format 0 based at least in part on the second symbol period comprising three or fewer symbols.

Aspect 19: The method of any of aspects 1 through 18, wherein the sidelink feedback message is transmitted based at least in part on a physical control channel format 1 based at least in part on the second symbol period comprising at least four symbols.

Aspect 20: The method of any of aspects 1 through 19, wherein transmitting the sidelink feedback message in the second symbol period comprises: transmitting a waveform in an initial symbol of the second symbol period; and transmitting a respective repetition of the waveform in each additional symbol of the second symbol period.

Aspect 21: The method of any of aspects 1 through 20, further comprising: selecting the second transmission time interval to transmit the sidelink feedback message based at least in part on a feedback timing configuration and a timing of the second transmission time interval relative to the first transmission time interval.

Aspect 22: The method of aspect 21, wherein the feedback timing configuration is based at least in part on a fixed feedback timeline, a feedback delay value indicated in sidelink control information received by the UE, or both.

Aspect 23: The method of any of aspects 1 through 22, wherein the first symbol period comprises an initial symbol of the second transmission time interval; the third symbol period comprises a final symbol of the second transmission time interval; and the second symbol period comprises one or more symbols, the one or more symbols comprising each symbol of the second transmission time interval between the initial symbol and the final symbol.

Aspect 24: An apparatus for wireless communication at a UE, comprising a processor; memory coupled with the processor; and instructions stored in the memory and executable by the processor to cause the apparatus to perform a method of any of aspects 1 through 23.

Aspect 25: An apparatus for wireless communication at a UE, comprising at least one means for performing a method of any of aspects 1 through 23.

Aspect 26: A non-transitory computer-readable medium storing code for wireless communication at a UE, the code comprising instructions executable by a processor to perform a method of any of aspects 1 through 23.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." Also, as used herein, the phrase "a set" shall be construed as including the possibility of a set with one member. That is, the phrase "a set" shall be construed in the same manner as "one or more."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communication at a user equipment (UE), comprising:
   at least one processor;
   at least one memory coupled with the at least one processor,
   the at least one memory storing instructions executable by the at least one processor to cause the apparatus to:
   identify, for a sidelink message scheduled for a first transmission time interval, a second transmission time interval for transmitting a sidelink feedback message corresponding to the sidelink message, wherein the first transmission time interval and the second transmission time interval are both shorter in duration than a third transmission time interval that includes the second transmission time interval;
   transmit automatic gain control information in a first symbol period of the second transmission time interval;
   transmit the sidelink feedback message in a second symbol period of the second transmission time interval that occurs chronologically after the first symbol period of the second transmission time interval; and
   switch from operating the UE in a transmitting mode to operating the UE in a receiving mode during a third symbol period of the second transmission time interval that occurs chronologically after the second symbol period of the second transmission time interval.

2. The apparatus of claim 1, wherein the instructions are further executable by the at least one processor to cause the apparatus to:
   receive configuration signaling that indicates, for a plurality of consecutive transmission time intervals that includes the second transmission time interval, that a first subchannel is allocated to sidelink feedback messages and a second subchannel different than the first subchannel is allocated to sidelink data or control information.

3. The apparatus of claim 1, wherein the instructions are further executable by the at least one processor to cause the apparatus to:
   receive a bitmap that indicates a set of physical resource blocks for carrying sidelink feedback messages within a sidelink bandwidth part; and
   transmit the sidelink feedback message via one or more physical resource blocks of the set of physical resource blocks.

4. The apparatus of claim 1, wherein:
   the third transmission time interval comprises a plurality of transmission time intervals, the second transmission time interval and a fourth transmission time interval included in the plurality of transmission time intervals; and
   the sidelink feedback message is transmitted within a subchannel that is allocated for sidelink data or control information during the fourth transmission time interval.

5. The apparatus of claim 4, wherein the instructions are further executable by the at least one processor to cause the apparatus to:
   receive an indication of a periodicity for a resource pool that comprises the plurality of transmission time intervals, wherein a subset of one or more transmission time intervals are allocated for sidelink feedback messages within the plurality of transmission time intervals based at least in part on the periodicity.

6. The apparatus of claim 1, wherein the instructions are further executable by the at least one processor to cause the apparatus to:
   receive a bitmap that indicates a set of physical resource blocks for carrying the sidelink feedback message within the second symbol period; and
   transmit the sidelink feedback message via one or more physical resource blocks of the set of physical resource blocks.

7. The apparatus of claim 1, wherein the instructions are further executable by the at least one processor to cause the apparatus to:

receive a subset of sidelink feedback resource indices of a plurality of sidelink feedback resource indices, wherein the plurality of sidelink feedback resource indices are mapped to a plurality of cyclic shift pairs and a plurality of physical resource blocks; and transmit the sidelink feedback message via one or more physical resource blocks and using a cyclic shift pair corresponding to one of the subset of sidelink feedback resource indices.

8. The apparatus of claim 1, wherein the instructions are further executable by the at least one processor to cause the apparatus to:

receive a feedback delay value that indicates a location of the second transmission time interval within the third transmission time interval.

9. The apparatus of claim 1, wherein the instructions are further executable by the at least one processor to cause the apparatus to:

transmit a power reservation signal in an initial symbol of the third transmission time interval based at least in part on the first transmission time interval in which the sidelink message is scheduled being before the third transmission time interval that includes the second transmission time interval.

10. The apparatus of claim 9, wherein the power reservation signal is based at least in part on a reference signal.

11. The apparatus of claim 10, wherein:

the reference signal comprises a comb-based reference signal, and a comb value for the reference signal is based at least in part on a location of the second transmission time interval within the third transmission time interval.

12. The apparatus of claim 9, wherein the power reservation signal is transmitted within a same resource block location in a frequency domain as the sidelink feedback message.

13. The apparatus of claim 1, wherein:

a sidelink feedback resource partition comprises a set of physical resource blocks, and a quantity of physical resource blocks within the set of physical resource blocks is based at least in part on a second quantity of physical resource blocks allocated for sidelink feedback messages within the second transmission time interval, a quantity of transmission time intervals allocated to sidelink messages and corresponding to the second transmission time interval, a quantity of subchannels included in the sidelink feedback resource partition, or any combination thereof.

14. The apparatus of claim 13, wherein the instructions are further executable by the at least one processor to cause the apparatus to:

select a physical resource block of the set of physical resource blocks for transmitting the sidelink feedback message based at least in part on a time-first-then-frequency mapping between resources allocated to the sidelink messages and the set of physical resource blocks.

15. The apparatus of claim 13, wherein, when a format of the sidelink feedback message is based at least in part on a physical uplink control channel format waveform, a quantity of sidelink feedback resources within the sidelink feedback resource partition is based at least in part on the quantity of physical resource blocks and a quantity of cyclic shift pairs per physical resource block of the set of physical resource blocks.

16. The apparatus of claim 13, wherein, when a format of the sidelink feedback message is based at least in part on a physical uplink control channel format waveform, a quantity of sidelink feedback resources within the sidelink feedback resource partition is based at least in part on the quantity of physical resource blocks, an orthogonal code spreading factor, and a quantity of cyclic shift pairs per resource block of the set of physical resource blocks.

17. The apparatus of claim 13, wherein the instructions are further executable by the at least one processor to cause the apparatus to:

select a sidelink feedback resource within the sidelink feedback resource partition based at least in part on a first value modulo a second value, wherein the first value is based at least in part on a sum of a layer source identifier and a group member identifier associated with the sidelink message, wherein the second value is based at least in part on a product of the quantity of physical resource blocks and a quantity of cyclic shift pairs per physical resource block of the set of physical resource blocks; and transmit the sidelink feedback message via the selected sidelink feedback resource.

18. The apparatus of claim 1, wherein the instructions are further executable by the at least one processor to cause the apparatus to:

transmit the sidelink feedback message based at least in part on a physical control channel format 0 based at least in part on the second symbol period comprising three or fewer symbols.

19. The apparatus of claim 1, wherein the instructions are further executable by the at least one processor to cause the apparatus to:

transmit the sidelink feedback message based at least in part on a physical control channel format 1 based at least in part on the second symbol period comprising at least four symbols.

20. The apparatus of claim 1, wherein, to transmit the sidelink feedback message in the second symbol period, the instructions are executable by the at least one processor to cause the apparatus to:

transmit a waveform in an initial symbol of the second symbol period; and transmit a respective repetition of the waveform in each additional symbol of the second symbol period.

21. The apparatus of claim 1, wherein the instructions are further executable by the at least one processor to cause the apparatus to:

select the second transmission time interval to transmit the sidelink feedback message based at least in part on a feedback timing configuration and a timing of the second transmission time interval relative to the first transmission time interval.

22. The apparatus of claim 21, wherein the feedback timing configuration is based at least in part on a fixed feedback timeline, a feedback delay value indicated in sidelink control information received by the UE, or both.

23. The apparatus of claim 1, wherein:

the first symbol period comprises an initial symbol of the second transmission time interval;

the third symbol period comprises a final symbol of the second transmission time interval; and the second symbol period comprises one or more symbols, the one or more symbols comprising each symbol of the second transmission time interval between the initial symbol and the final symbol.

24. A method for wireless communication at a user equipment (UE), comprising:

identifying, for a sidelink message scheduled for a first transmission time interval, a second transmission time interval for transmitting a sidelink feedback message corresponding to the sidelink message, wherein the first transmission time interval and the second transmission time interval are both shorter in duration than a third transmission time interval that includes the second transmission time interval;

transmitting automatic gain control information in a first symbol period of the second transmission time interval;

transmitting the sidelink feedback message in a second symbol period of the second transmission time interval that occurs chronologically after the first symbol period of the second transmission time interval; and switching from operating the UE in a transmitting mode to operating the UE in a receiving mode during a third symbol period of the second transmission time interval that occurs chronologically after the second symbol period of the second transmission time interval.

25. The method of claim 24, further comprising:

receiving configuration signaling that indicates, for a plurality of consecutive transmission time intervals that includes the second transmission time interval, that a first subchannel is allocated to sidelink feedback messages and a second subchannel different than the first subchannel is allocated to sidelink data or control information.

26. The method of claim 24, further comprising:

receiving a bitmap that indicates a set of physical resource blocks for carrying sidelink feedback messages within a sidelink bandwidth part, wherein the sidelink feedback message is transmitted via one or more physical resource blocks of the set of physical resource blocks.

27. The method of claim 24, wherein:

the third transmission time interval comprises a plurality of transmission time intervals, the second transmission time interval and a fourth transmission time interval included in the plurality of transmission time intervals; and the sidelink feedback message is transmitted within a subchannel that is allocated for sidelink data or control information during the fourth transmission time interval.

28. The method of claim 27, further comprising:

receiving an indication of a periodicity for a resource pool that comprises the plurality of transmission time intervals, wherein a subset of one or more transmission time intervals are allocated for sidelink feedback messages within the plurality of transmission time intervals based at least in part on the periodicity.

29. An apparatus for wireless communication at a user equipment (UE), comprising:

means for identifying, for a sidelink message scheduled for a first transmission time interval, a second transmission time interval for transmitting a sidelink feedback message corresponding to the sidelink message, wherein the first transmission time interval and the second transmission time interval are both shorter in duration than a third transmission time interval that includes the second transmission time interval;

means for transmitting automatic gain control information in a first symbol period of the second transmission time interval;

means for transmitting the sidelink feedback message in a second symbol period of the second transmission time interval that occurs chronologically after the first symbol period of the second transmission time interval; and means for switching from operating the UE in a transmitting mode to operating the UE in a receiving mode during a third symbol period of the second transmission time interval that occurs chronologically after the second symbol period of the second transmission time interval.

30. A non-transitory computer-readable medium storing code for wireless communication at a user equipment (UE), the code comprising instructions executable by a processor to:

identify, for a sidelink message scheduled for a first transmission time interval, a second transmission time interval for transmitting a sidelink feedback message corresponding to the sidelink message, wherein the first transmission time interval and the second transmission time interval are both shorter in duration than a third transmission time interval that includes the second transmission time interval;

transmit automatic gain control information in a first symbol period of the second transmission time interval;

transmit the sidelink feedback message in a second symbol period of the second transmission time interval that occurs chronologically after the first symbol period of the second transmission time interval; and switch from operating the UE in a transmitting mode to operating the UE in a receiving mode during a third symbol period of the second transmission time interval that occurs chronologically after the second symbol period of the second transmission time interval.

* * * * *